US007633539B2

(12) United States Patent
Yamashita

(10) Patent No.: US 7,633,539 B2
(45) Date of Patent: Dec. 15, 2009

(54) IMAGE PICKUP DEVICE WITH ANALOG-TO-DIGITAL CONVERTER

(75) Inventor: Yuichiro Yamashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 747 days.

(21) Appl. No.: 10/555,890

(22) PCT Filed: Jun. 1, 2005

(86) PCT No.: PCT/JP2005/010452

§ 371 (c)(1),
(2), (4) Date: Nov. 7, 2005

(87) PCT Pub. No.: WO2005/122556

PCT Pub. Date: Dec. 22, 2005

(65) Prior Publication Data

US 2007/0046795 A1      Mar. 1, 2007

(30) Foreign Application Priority Data

| Jun. 7, 2004 | (JP) | ............................. 2004-168579 |
| Jun. 7, 2004 | (JP) | ............................. 2004-168589 |

(51) Int. Cl.
  *H04N 3/14* (2006.01)
(52) U.S. Cl. .................................... 348/294
(58) Field of Classification Search ................ 348/294; 341/126, 155, 158, 166
  See application file for complete search history.

(56) References Cited

U.S. PATENT DOCUMENTS

| 4,110,746 A | * | 8/1978 | Furukawa et al. ........... 341/140 |
| 4,688,017 A | * | 8/1987 | Huebner et al. ............. 341/137 |
| 5,880,691 A | * | 3/1999 | Fossum et al. .............. 341/162 |
| 6,133,862 A | * | 10/2000 | Dhuse et al. ................. 341/118 |
| 2002/0154233 A1 | | 10/2002 | Yoshimura et al. .......... 348/308 |

FOREIGN PATENT DOCUMENTS

| JP | 55-008104 A | 1/1980 |
| JP | 55-8104 A | 1/1980 |
| JP | 55-039455 A | 3/1980 |
| JP | 59-202724 A | 11/1984 |
| JP | 5-028129 A | 2/1993 |
| JP | 5-048460 A | 2/1993 |
| JP | 5-48460 A | 2/1993 |

(Continued)

*Primary Examiner*—Jason Chan
*Assistant Examiner*—Joel Fosselman
(74) *Attorney, Agent, or Firm*—Fitzpatrick, Cella, Harper & Scinto

(57) ABSTRACT

In an image pickup device with A/D converters at each column signal line, improvements in the A/D conversion speed and accuracy in image sensors having A/D converters are achieved. In an image pickup device wherein sensing elements are arranged in a matrix and A/D converters are arranged for each column signal line, the A/D converter first retains in its memory unit as an initial value an electric signal corresponding to the signal of the sensing element which is an analog signal, then initiates charge or discharge of the memory unit at a rate corresponding to the size of an input fixed signal, measures the time period from either the charge start time or the discharge start time until the memory unit electric signal becomes equal to the reference signal, and then recognizes the measured time period as a digital value.

19 Claims, 22 Drawing Sheets

FOREIGN PATENT DOCUMENTS

| | | |
|---|---|---|
| JP | 5-219452 A | 8/1993 |
| JP | 5-78041 | 10/1993 |
| JP | 7-193507 A | 7/1995 |
| JP | 2002-027331 A | 1/2002 |
| JP | 2002-33962 | 1/2002 |

* cited by examiner

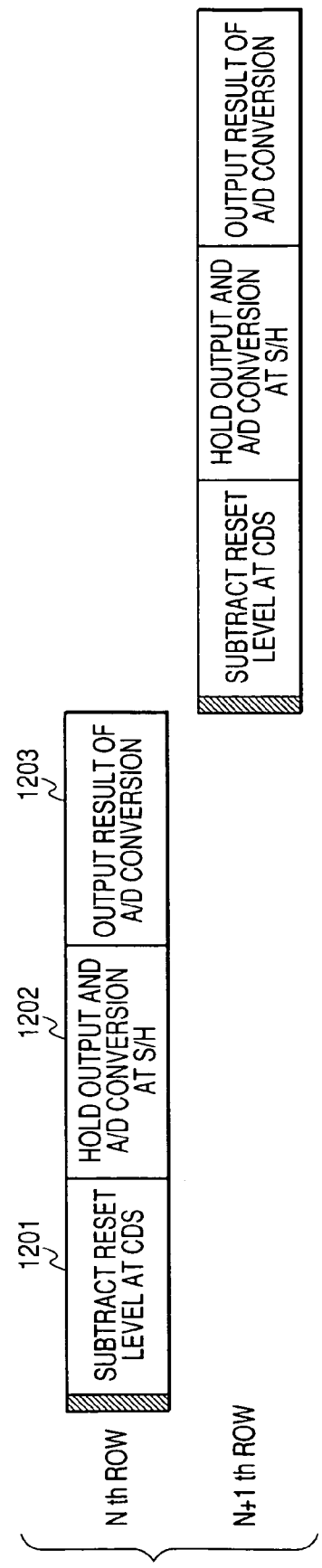
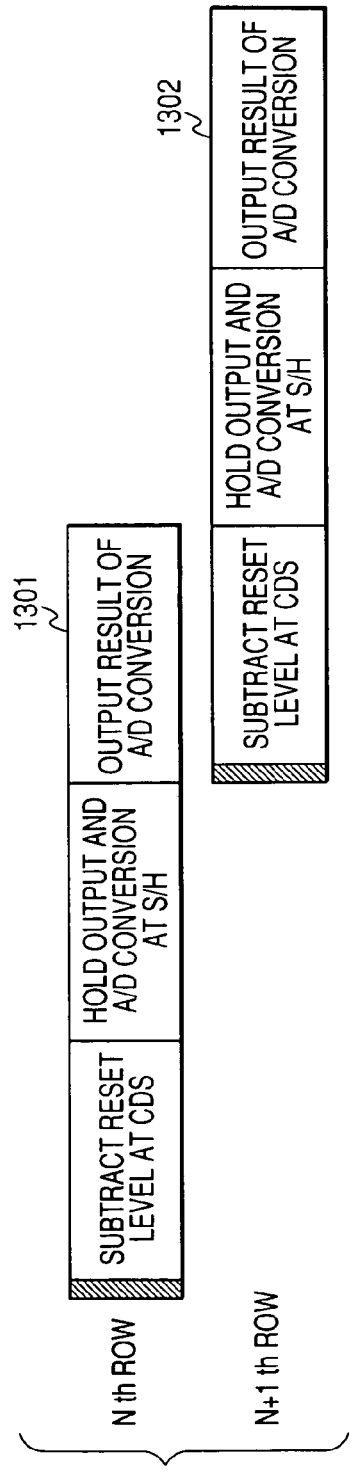

IMAGE PICKUP DEVICE WITH ANALOG-TO-DIGITAL CONVERTER

TECHNICAL FIELD

The present invention relates to an image pickup device and image pickup system comprising arrays of high-speed, high precision A/D converters per column, as used in CCD image sensors, CMOS image sensors, near-infrared and far-infrared image sensors, with pixels arranged in a matrix, wherein an unit pixel is an element which converts energy into electric signals, such as in photoelectric conversion.

BACKGROUND ART

Due to integration of CMOS logic process and image sensor process, the image sensors of today are capable of producing complicated analog circuits or digital circuits and signal processing units on a sensor chip. One of the significant applications is an image sensor equipped with an analog-to-digital converter (A/D converter) on an image sensor chip wherein pixels are arranged two-dimensionally.

A column parallel A/D conversion architecture having respective A/D converters for each column is particularly used to mount A/D converters onto an image sensor. Since this method enables the conversion rate per A/D converter to be lowered from a per-pixel reading rate to a per-row reading rate, the speed of the A/D converter itself can be reduced, in turn reducing total power consumption, and as a result speeding-up of the reading rate of the image sensor can be achieved more easily.

The aforementioned image sensor using column parallel A/D conversion conventionally included a lamp-type image sensor which sweeps triangular waves, as disclosed in Japanese Patent Application Laid-Open No. H05-048460, a successive approximation type image sensor, as disclosed in U.S. Pat. No. 5,880,691, and an image sensor using a method wherein a reference voltage is discharged at a rate determined by a pixel's output voltage, as disclosed in Japanese Patent Application Laid-Open No. 2002-033962.

Successive approximation type image sensors have limited application, since large circuits are required to ensure accuracy, and therefore necessitate larger image sensor chip sizes. On the other hand, lamp-type image sensors and image sensors using a reference voltage discharging-type A/D converter are superior in that they allow a more compact-sized circuit.

An example of an image sensor with a lamp-type A/D converter, as disclosed in Japanese Patent Application Laid-Open No. H05-048460, is shown in FIG. 22. In each row of the lamp-type A/D converter is a digital memory comprising a voltage comparator 10, a switch 11 and a digital data accumulation portion 12, and every digital memory is connected to a common counter 5. A signal from a pixel is input as an analog signal via a transfer switch 3 to one end of the voltage comparator 10, while a triangular wave from D/A converter 9 is applied to the other end to have the digital memories of each column retain the value of the counter when the comparator of each column is inverted. Since the triangular wave changes its voltage as it synchronizes with the counter 5, for instance a 8-bit A/D converter requires a processing time of 2 to the 8th power, or 256, steps for sweeping the triangular waves.

An example of an image sensor with a reference voltage discharge-type A/D converter, disclosed in Japanese Patent Application Laid-Open No. 2002-033962, is shown in FIG. 23. While it comprises a voltage comparator and digital memory in the same manner as a lamp-type A/D converter, it first accumulates a constant reference voltage as an electric charge at the comparator, and discharges the charge in the form of an electric current proportional to a pixel signal that has been voltage/current converted at a current mirror circuit 2315, and finally counts the time until the comparator inverts.

FIG. 24 shows an example of a successive approximation type image sensor, as disclosed in U.S. Pat. No. 5,880,691. The successive approximation-type comprises in each row a reference voltage generator which uses a voltage comparator, a digital memory and a digital-to-analog (D/A) converter. A signal from a pixel is applied to one end of the voltage comparator, while a voltage from the reference voltage generator is applied to the other end. Based on the comparison results of the comparator, the reference voltage generator successively changes value, and, for instance, an 8-bit A/D conversion requires a processing time for 8 steps.

The conventional methods described above successively input various types of reference voltage from the reference voltage generator to the comparator, and count the time until a match with the pixel signal is found, instead of comparing a reference voltage and a pixel signal using discharge/charge times. Therefore, since it is necessary to generate multiple reference voltages without variation, production yield will be lowered due to greater circuit size.

As described above, in image sensors with A/D converters built-in in a column parallel pattern, problems have arisen when attempting improvements in speed and accuracy of the A/D converters while maintaining circuit size. For the A/D converter built-in image sensors exemplified above, the reasons for the difficulty in improvements in speed and accuracy while maintaining circuit size will be explained below.

Firstly, in image sensors using lamp-type A/Ds, there is a problem of a slower conversion rate when the number of bits is increased. In lamp-type A/D converters, conversion of N bits requires 2 to the Nth power comparison steps. For instance, when N=12, a great number, such as 4096, of steps are required.

Secondly, in image sensors using lamp-type A/Ds, there is a problem of difficulty in improving speed for further multi-bit enhancement, due to the difficulty of shortening unit-time per step. Since a triangular wave is supplied to the entire sensor face as an analog voltage, it is impossible on principle to shorten the duration of each step beyond a certain duration determined by a RC time constant, required to stabilize the triangular wave output throughout the entire chip. Therefore, when the number of steps is increased due to further multi-bit enhancement, it is impossible to achieve faster speed by shortening duration of each step.

Thirdly, in image sensors having reference voltage discharge A/D converters, the current value will be significantly low when the pixel signal is significantly low during discharge of a constant voltage. Therefore, inversion of the comparator due to discharge requires a long waiting period, suggesting that the underlying principle itself is inappropriate when considering improvement of speed. Furthermore, the circuit for converting voltage to current is insufficient, and the charge gradient displays a significantly nonlinear behavior.

Fourthly, in image sensors using successive approximation-type A/Ds, increase of chip dimensions become a problem. For successive approximation-type A/D converters, the underlying principle places great emphasis on the precision of D/A converters for generating reference voltage. In order to maintain precision, it is necessary to design a circuit while providing enough allowance to effectively ignore the influences of variations resulting from the production process, and as a result, the resistance and capacitance for generating a reference voltage becomes significantly large among the chip, lending to an increase in chip dimensions.

As seen in the problems described above, no solutions currently exist to bring into realization an image sensor equipped with a high-precision, high-speed column-parallel A/D converter with a compact circuit size suitable for image sensors.

DISCLOSURE OF THE INVENTION

Therefore, it is an object of the present invention to realize, in image pickup devices with column-parallel A/D converters, further improvements in the A/D conversion speed and precision in image sensors equipped with A/D converters by providing a method of shortening time per step through the use of a method which does not require applying an analog voltage which changes from moment-to-moment to the entire sensor, as well as a method with high precision which is not influenced by increased discharge time due to pixel signal level.

It is another object of the present invention to provide, in image pickup devices with column-parallel A/D converters, an image pickup device with high-speed, high-precision A/D converters arranged per column while maintaining compact circuit size.

The image pickup device of the present invention is characterized by an image pickup device wherein sensing elements are arranged in a matrix and an A/D converter is provided for each column of the sensing elements, wherein the A/D converter first retains in its memory unit as an initial value an electric signal corresponding to the signal of the sensing element which is an analog signal, and initiates charge or discharge of the memory unit at a rate corresponding to the size of an input fixed signal, and measures a time period from either the charge start time or the discharge start time until the memory unit electric signal becomes equal to the reference signal, and recognizes the measured time period as a digital value.

With such an image pickup device, it is no longer necessary to apply a reference voltage which changes from moment-to-moment in the entire sensor, and it is possible to shorten, in comparison with image sensors using lamp-type A/D conversion, the time required for one comparison step of the comparator of the A/D converter, and therefore enables the improvement of A/D conversion speed. In addition, since it sets as initial value an optical signal and subsequently discharges at a constant gradient, it is always able to conclude comparison with fewer steps than as required by a reference voltage discharge-type.

In the image pickup device in the present invention, it is preferable to have the A/D converter comprise an integrator, and the initial value determined by integrating for a certain period of time the sensing element's signal with the integrator, and the determined initial value either charged or discharged using the integrator.

With such an image pickup device, since both the setting and the discharge of the initial value are carried out using an integrator with the same time constant, it is possible to configure an image pickup device wherein variation in the charge property in adjacent A/D converters does not influence the variation of A/D conversion error.

In the image pickup device in the present invention, it is preferable that the image pickup device comprises a digital counter while the A/D converter comprise an integrator, comparator and digital memory, the integrator output is connected to the comparator input, the comparator output is connected to a loading trigger terminal of the digital memory, and the digital counter is connected to the input terminal of the digital memory, and the digital counter output to be stored in the digital memory is the digital value.

With such an image pickup device, it is possible to easily provide high precision A/D converters in each column using a general electric circuit.

In the image pickup device in the present invention, it is preferable to have the integrator comprise an operational amplifier, a resistor to be connected to one of the input terminals of the operational amplifier, and a capacitor to be connected between the one of the input terminals and an output terminal of the operational amplifier.

With such an image pickup device, it is possible to configure an integrator with high precision, and install on the image pick up device an A/D converter with good linearity and high precision that is independent to the signal level of the sensing element.

In the image pickup device in the present invention, it is preferable to have the integrator comprise an operational amplifier, and a switched capacitor circuit which is connected to one of the input terminals of the operational amplifier.

With such an image pickup device, it is possible to configure the resister necessary for the integrator with capacitors, thereby making the equivalent resistance value variable through control, resulting in an A/D conversion property that is changeable as needed.

In the image pickup device in the present invention, it is possible to have a memory unit function as an output portion of the integrator.

In the image pickup device in the present invention, it is preferable to have the sensing elements arranged in a column direction selectively connected to a vertical output line (for instance, the sensing elements arranged in a column direction are selected per row and connected to a vertical output line), and the vertical output line and the A/D converter connected via a voltage amplifier.

With such an image pickup device, it is possible to reduce effective input quantization noise by amplifying signal, thereby reducing fixed pattern noise during sample holding of the A/D conversion, and to reduce random noise during A/D conversion, and to reduce the influence from quantization error.

In the image pickup device in the present invention, it is preferable to have the sensing elements arranged in a column direction selectively connected to a vertical output line, and the vertical output line and the A/D converter connected via a noise reduction circuit, and the noise reduction circuit have a function to reduce the noise signal of the sensing element from the signal after sensing.

With such an image pickup device, it is possible to expand the dynamic range of the A/D conversion, as compared to a method wherein the noise level is subtracted from the signal level after A/D conversion.

In the image pickup device in the present invention, it is preferable to start reading a row before the output of the signal of another row after sensing from the A/D converter is concluded.

With such an image pickup device, it is possible to effectively read the data of each row within a time that is shorter than the time required from the reading of the signal from a sensing element of a row to the output of the digital data.

According to the present invention, in an image pickup device with column-parallel A/D converters, a method of shortening time per step through the use of a method which does not require applying an analog voltage which changes from moment-to-moment to the entire sensor, and a method with high-precision which is not influenced by increased discharge time due to pixel signal level can both be provided.

In addition, according to the present invention, in image pickup devices with column-parallel A/D converters, an image pickup device with high-speed, high-precision A/D converters arranged per column while maintaining compact circuit size can be provided.

The image pickup device of the present invention is characterized by an image pickup device having sensing elements arranged in a matrix and an A/D converter provided for each column of the sensing element, wherein the A/D converter first retains in its memory unit as an initial value an electric signal corresponding to the signal of the sensing element which is an analog signal, initiates charge or discharge of the memory unit by a subsequently input first fixed signal, discretely measures the time period from the start of the charge or the discharge until the electric signal of the memory unit becomes equal to the reference signal, initiates charge or discharge of the memory unit by a subsequently input second fixed signal, discretely measures the time for an electric signal exceeding the reference signal of the memory unit after measurement becomes equal to the reference signal, and sets the measured time period as a digital signal.

In this case, "discretely measure" means "digitally measure". In the present invention, when measuring charge or discharge time, an instrument such as a digital counter is used, wherein the counter is counted upwards; for instance, 1, 2, 3, 4, 5, . . . . With such an image pickup device, in image pickup devices with column-parallel A/D converters, an image pickup device with high-speed, high-precision A/D converters arranged per column can be provided while maintaining compact circuit size.

In the image pickup device in the present invention, it is preferable that the first fixed signal and the second fixed signal is the same.

With such an image pickup device, it is possible to assemble the required fixed voltage generating circuit into one, thereby realizing downsizing of the circuit.

In the image pickup device in the present invention, it is preferable to repeat more than twice the process of either charge or discharge in order to ensure that an electric signal exceeding the reference signal becomes equal to the reference signal.

With such an image pickup device, it is possible to further reduce the number of steps for A/D conversion of the image pickup device that has an A/D converter for each column.

In the image pickup device in the present invention, it is preferable that the process of re-charge or re-discharge in order to ensure that an electric signal exceeding the reference signal reaches the reference signal is conducted through the synchronous operation of two or more A/D converters provided for each column of sensing element.

With such an image pickup device, it is possible to generate a counter signal required by A/D converters arranged parallel in columns from just one counter, thereby significantly reducing circuit size.

In the image pickup device in the present invention, it is preferable that the A/D converter comprises an integrator, and the initial value is determined by integrating for a predetermined period of time the sensing element's signal with the integrator, and that the determined initial value is either charged or discharged using the integrator.

With such an image pickup device, it is possible to correct the difference in discharge time constants for each column on a per-column basis, and therefore realizing an image pickup device which obtains A/D conversion results with minimal variation.

In the image pickup device in the present invention, it is preferable that the image pickup device comprises a counter while the A/D converter comprises an integrator, a comparator and a memory, the integrator output is connected to the input terminal of the comparator, the comparator output is connected to a loading trigger terminal of the digital memory, the counter is connected to the input terminal and the counter output to be stored in the digital memory is the digital value.

With such an image pickup device, it is possible to realize an image pickup device with high precision A/D converters provided in each column in a simple circuit.

In the image pickup device in the present invention, it is preferable to have the integrator comprise an operational amplifier, a resistor to be connected to one of the input terminals of the operational amplifier, and a capacitor to be connected between the one of the input terminals and an output terminal of the operational amplifier.

With such an image pickup device, it is possible to configure an integrator with high precision, and install on the image pick up device an A/D converter with good linearity and high precision that is independent to the signal level of the sensing element.

In the image pickup device in the present invention, it is preferable that the resistor comprises a switched capacitor.

With such an image pickup device, it is possible to configure the resister necessary for the integrator with capacitors, thereby making the equivalent resistance value variable through control, resulting in an image pickup device with A/D converters arranged in parallel columns wherein the A/D conversion property is changeable as needed.

In the image pickup device in the present invention, the memory unit is, for instance, an output portion of the integrator (capacitor of the output portion of the integrator).

In the image pickup device in the present invention, it is preferable to have the sensing elements arranged in a column direction selectively connected to a vertical output line (when connected to a vertical output line, they are connected via elements with a function for selecting each row, such as switches), and the vertical output line and the A/D converter are connected via at least a voltage amplifier.

With such an image pickup device, it is possible to reduce effective input quantization noise by amplifying the signal, thereby reducing fixed pattern noise during the sample holding of the A/D conversion of an image pickup device with A/D converters arranged in parallel columns, reducing random noise during A/D conversion, and reducing the influence from quantization error.

In the image pickup device in the present invention, it is preferable to have the sensing elements arranged in a column direction selectively connected to a vertical output line (when connected to a vertical output line, they are connected via elements with a function for selecting each row, such as switches), and at least a noise reduction circuit is connected between the vertical output line and the A/D converter, and the noise reduction circuit has a function to reduce the noise signal of the sensing element from the signal after sensing.

With such an image pickup device, it is possible to expand the dynamic range of the A/D conversion of an image pickup device with A/D converters arranged in parallel columns, as compared to a method wherein the noise level is subtracted from the signal level after A/D conversion.

In the image pickup device in the present invention, it is preferable to have the differential voltage, of the electric signal exceeding the reference signal and the reference signal, amplified by amplifying means prior to being charged or discharged.

With such an image pickup device, it is possible to provide allowance in the determination precision of the comparator, and a similar efficiency can be obtained while constricting the sizes and number of the parts comprising the A/D converter of an image pickup device with A/D converters arranged in parallel columns.

In the image pickup device in the present invention, it is preferable to have the differential voltage of the electric signal exceeding the reference signal and the reference signal retained in the first terminal, and to have the amplifying means voltage-amplify via the integrator the differential voltage retained in the first terminal after sample holding, and overwrite the voltage subsequent to the voltage amplification onto the first terminal.

With such an image pickup device, it is possible to adjust the desired gain with an amplifier, thereby enabling greater freedom in design.

In the image pickup device in the present invention, it is preferable to start reading a row before digital data output operation of another row after the A/D conversion is concluded.

With such an image pickup device, further improvement in speed can be achieved in an image pickup device with column-parallel A/D converters, and it is possible to effectively read the data of each row within a period of time that is shorter than the time required from the reading of the signal from a sensing element of a row to the output of the digital data.

According to the present invention, in an image pickup device with column-parallel A/D converters, a method of shortening time per step through the use of a method which does not require applying an analog voltage which changes from moment-to-moment in the entire sensor, and an A/D conversion method with high-precision which is not influenced by increased discharge time due to pixel signal level can both be provided.

In addition, according to the present invention, in an image pickup device with column-parallel A/D converters, an image pickup device with high-speed, high-precision A/D converters arranged per column while maintaining compact circuit size can be provided.

BRIEF DESCRIPTION OF THE DRAWINGS

FIG. 12 is a diagram showing an example of an operation according to the fourth embodiment of the present invention;

FIG. 13 is a diagram showing an example of an operation according to the fourth embodiment of the present invention;

BEST MODE FOR CARRYING OUT THE INVENTION

Preferred embodiments of the present invention will now be described with reference to the drawings.

Figure 1:
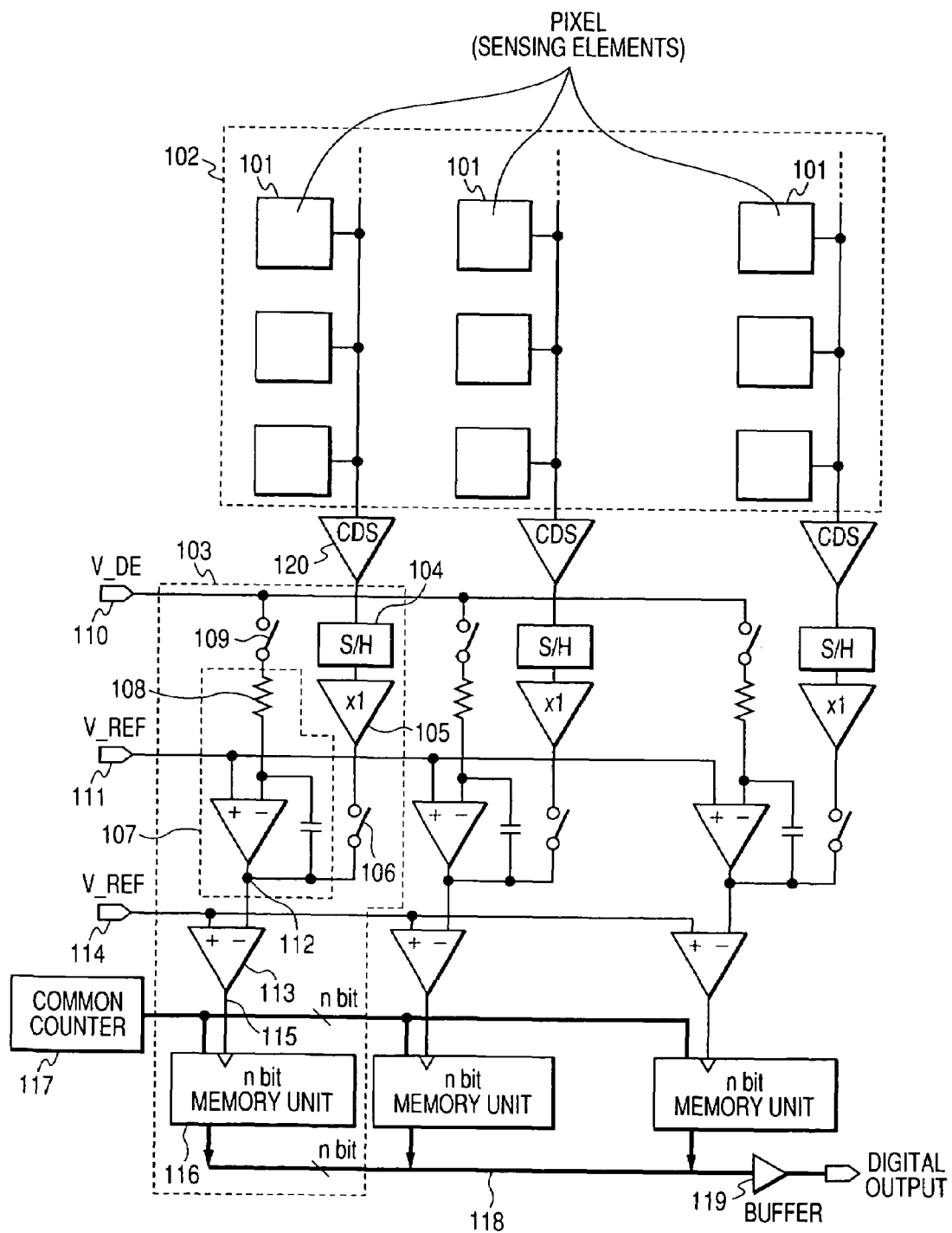
FIG. 1 is a diagram showing an example of a circuitry according to a first embodiment of the image pickup device of the present invention.

A first embodiment of the present invention will be described with reference to FIG. 1. FIG. 1 is a diagram showing an example of a circuitry according to a first embodiment of the image pickup device of the present invention. As an example of a sensing element, the diagram gives a sensing element which is a pixel capable of photoelectric conversion, wherein pixels 101 are arranged in a matrix to configure a pixel portion 102 to convert two-dimensional image signals to electric signals such as a charge or a voltage. These pixels are, for instance, CCDs comprising photodiodes, CMOS sensors, near-infrared sensors, or sensors that convert far-infrared rays to heat and then to electric signals. Possible forms are by no means limited to the above, and the sensing elements can, for instance, be pressure sensors.

In FIG. 1, reference numeral 103 denotes an A/D converter, and the signal from the group of pixels are input to the A/D converter 103 via a CDS (correlated double sampling) circuit 120 which removes reset noise.

The signal from the pixels after CDS is connected to an output 112 of an integrator 107 via a sample holding (S/H) circuit 104, a buffer 105 and a switch 106. One of the input terminals of the integrator 107 is connected to a fixed voltage (V_DE) for integration 110 through the resistor 108 and the switch 109, and a reference voltage 111 is connected to the other of the input terminals of the integrator 107.

An output terminal 112 of the integrator 107 is connected to the input terminal of a comparator 113, and the comparator 113 compares an output 112 of the integrator 107 with a reference voltage 114. In this example, the same voltage V_REF is applied to the reference voltage 111 and the reference voltage 114. An output 115 of the comparator 113 determines the loading trigger of an n-bit memory unit 116, and holds a value output by a counter 117. The memory units of each A/D converter 103 are selectively connected to a horizontal digital signal line 118, and are output externally via a buffer 119.

Each memory unit is connected via a switch, not shown, to the horizontal digital signal line 118, and selectively outputs by turning on one switch at a time. For a switch pulse, a method wherein an address is decoded, or a method wherein the switches are turned on sequentially for each row using a digital shift resister, among other methods, can be used. In this fashion, selective output from the digital memory to the horizontal digital signal line 118 is performed.

The buffer, switch, resister etc. are all modelized at a function level and described, and there is no limit to their specific embodiments. This is a design issue which will be selected after deciding which production process or circuit technology will be used. For instance, when creating a buffer, a CMOS inverter may be used, or the output can be performed after amplifying the voltage by positive feedback with a device called a sense amplifier and once again passing it through the CMOS inverter and then output. A CMOS inverter is a circuit for actively amplifying an electric signal and transmitting it after altering output impedance (normally decreasing it). Since a signal is inverted by a CMOS inverter, an impedance converter called a buffer is configured by serially connecting two inverters.

When creating a switch, many methods may be used, including simply controlling it by turning on and off a gate voltage of a single MOS transistor, or creating a switch using logic including AND and OR, or using a bipolar transistor, JFET or SIT instead of a MOS transistor.

When creating a resistor, many methods may be used, including using a metal to be wrapped around, or using polysilicon, or creating a resistor by ion implantation on a silicon substrate.

Figure 2:
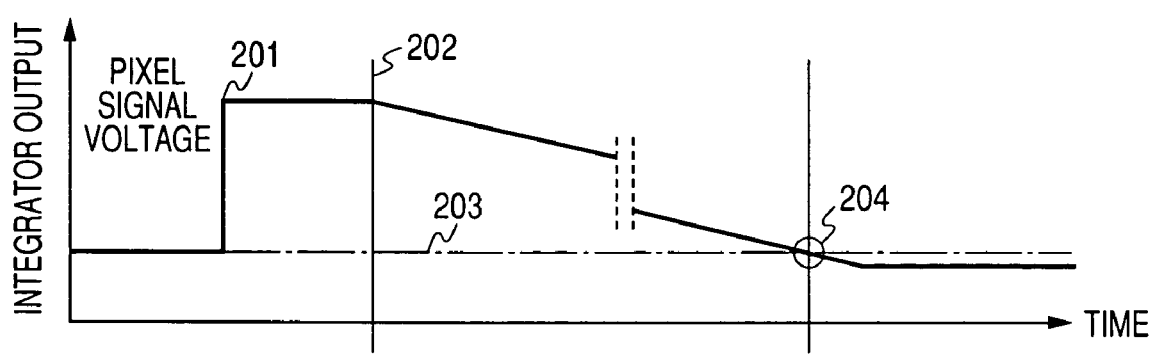
FIG. 2 is a diagram showing an example of an operation according to the first embodiment of the image pickup device of the present invention.
Figure 3:
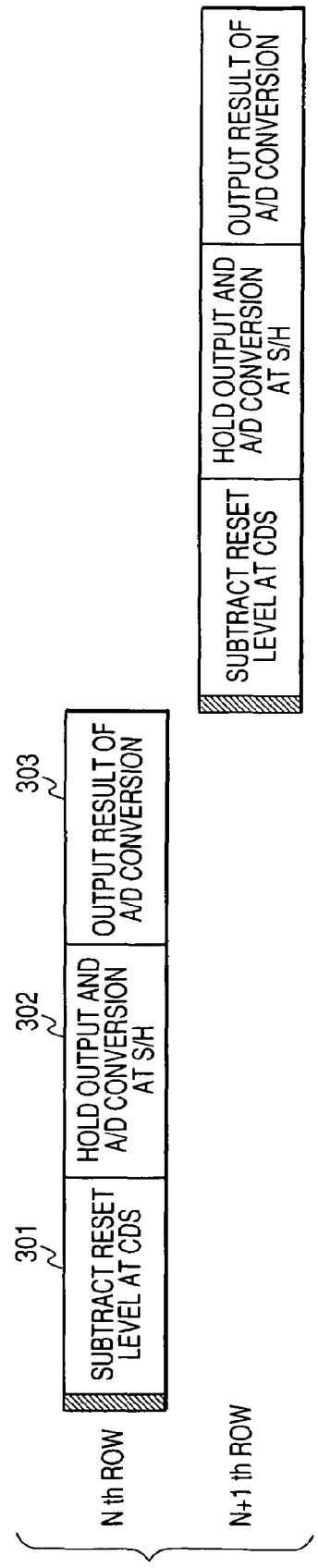
FIG. 3 is a diagram showing an example of an operation according to the first embodiment of the image pickup device of the present invention.
Figure 4:
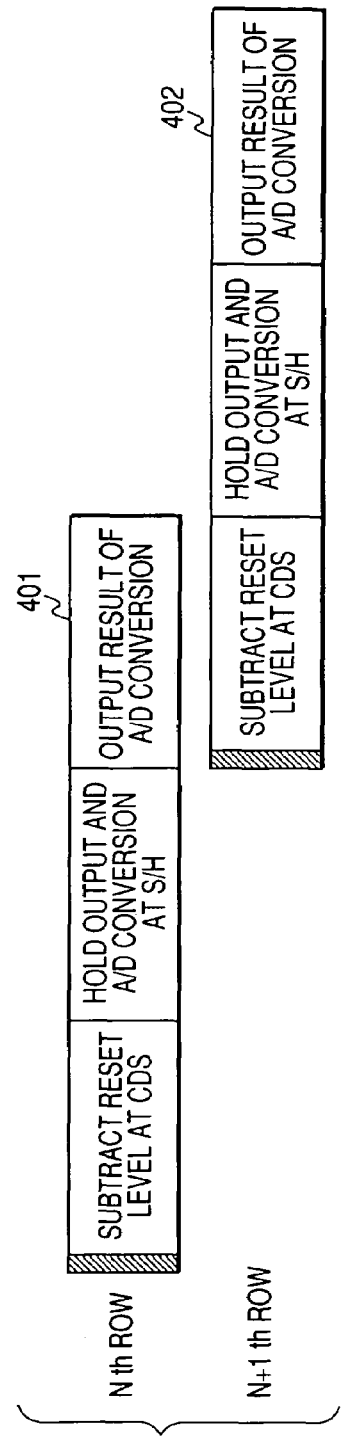
FIG. 4 is a diagram showing an example of an operation according to the first embodiment of the image pickup device of the present invention.
Figure 5:
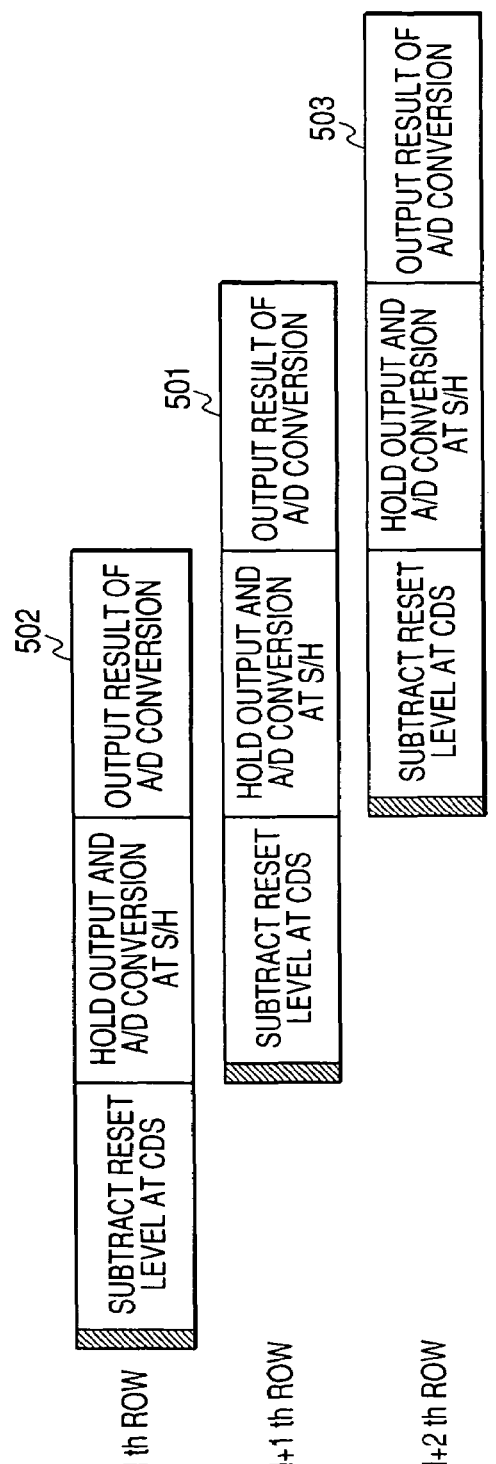
FIG. 5 is a diagram showing an example of an operation according to the first embodiment of the image pickup device of the present invention.

The operation of the circuit will be explained with reference to FIGS. 2 through 5. FIG. 2 shows the voltage transition of an output portion 112 of an integrator, and FIGS. 3 through 5 are charts illustrating the operation of each row at a function level, in relation to time.

The fundamental principle is that during synchronous count up of a signal of a counter 117, a trigger is received from a comparator 113 and then the counter value is loaded into a memory 116, and A/D conversion is achieved by using the proportional relation of the signal from the pixel, and the time required by discharge by integration.

The signal subsequent to CDS (correlated double sampling) is first applied to an output 112 of an integrator via a sample holding circuit 104, a buffer 105 and a switch 106. As the switch 106 is turned off, a signal 201 from a pixel is stored at the output terminal 112 of the integrator (the signal is stored in a capacitor of the output portion of the integrator). At time point 202 a switch 109 is turned on, and at the same time, a common counter 117 commences counting. Integration proceeds with a negative gradient towards a reference voltage 203. At time point 204, as the output 112 of the integrator intersects with the reference voltage 203, a comparator 113 sends a trigger to a memory unit 116, and then the value of the counter 117 is loaded into the memory unit 116.

The time elapsed from the commencement of integration, in other words the time from the time point 202 to the time point 204, is proportional to the signal 201 from the pixel. Therefore, the value of the counter loaded into the memory is the outcome of the A/D conversion.

Figure 22:
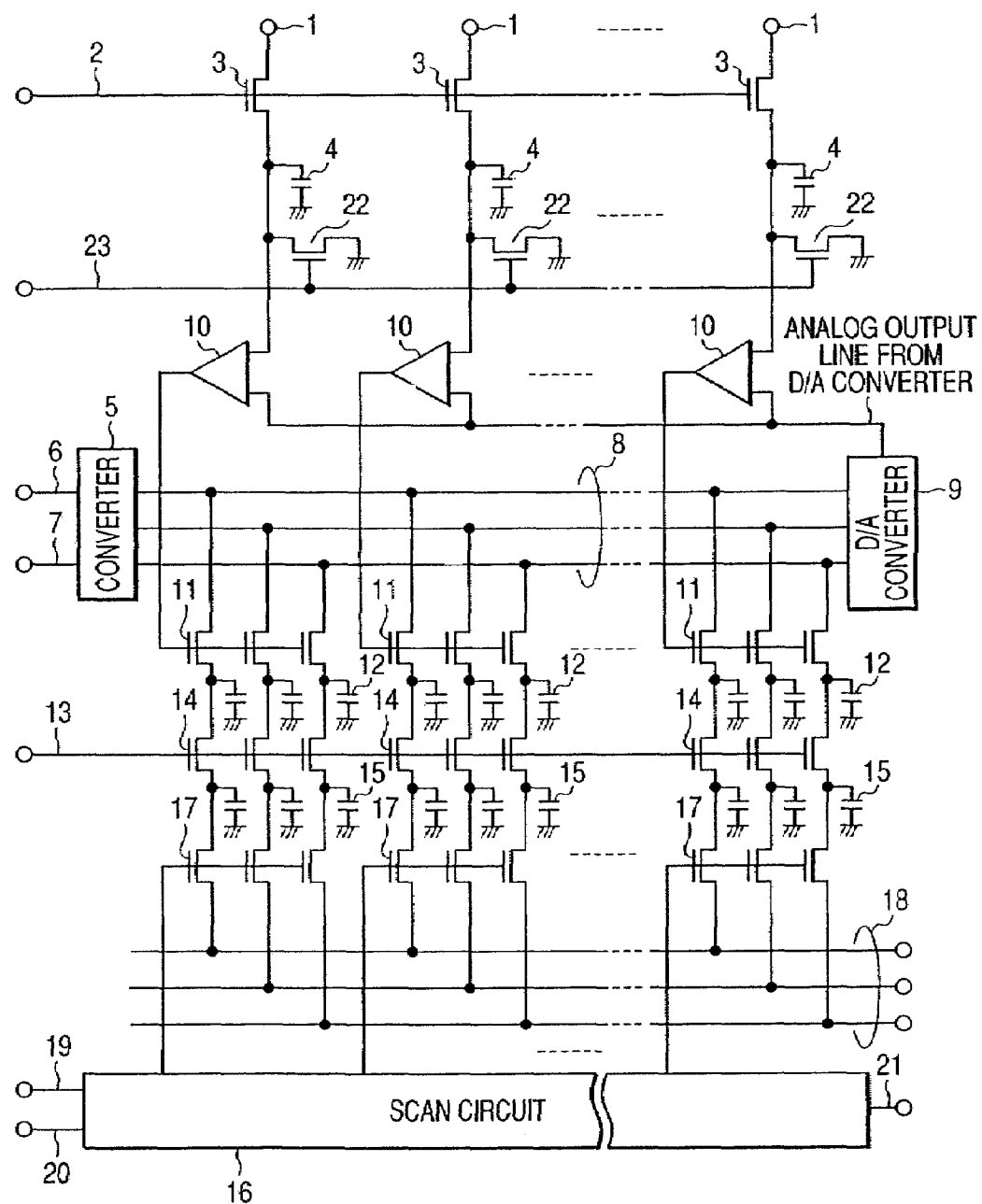
FIG. 22 is a diagram showing an example of the prior art.
Figure 23:
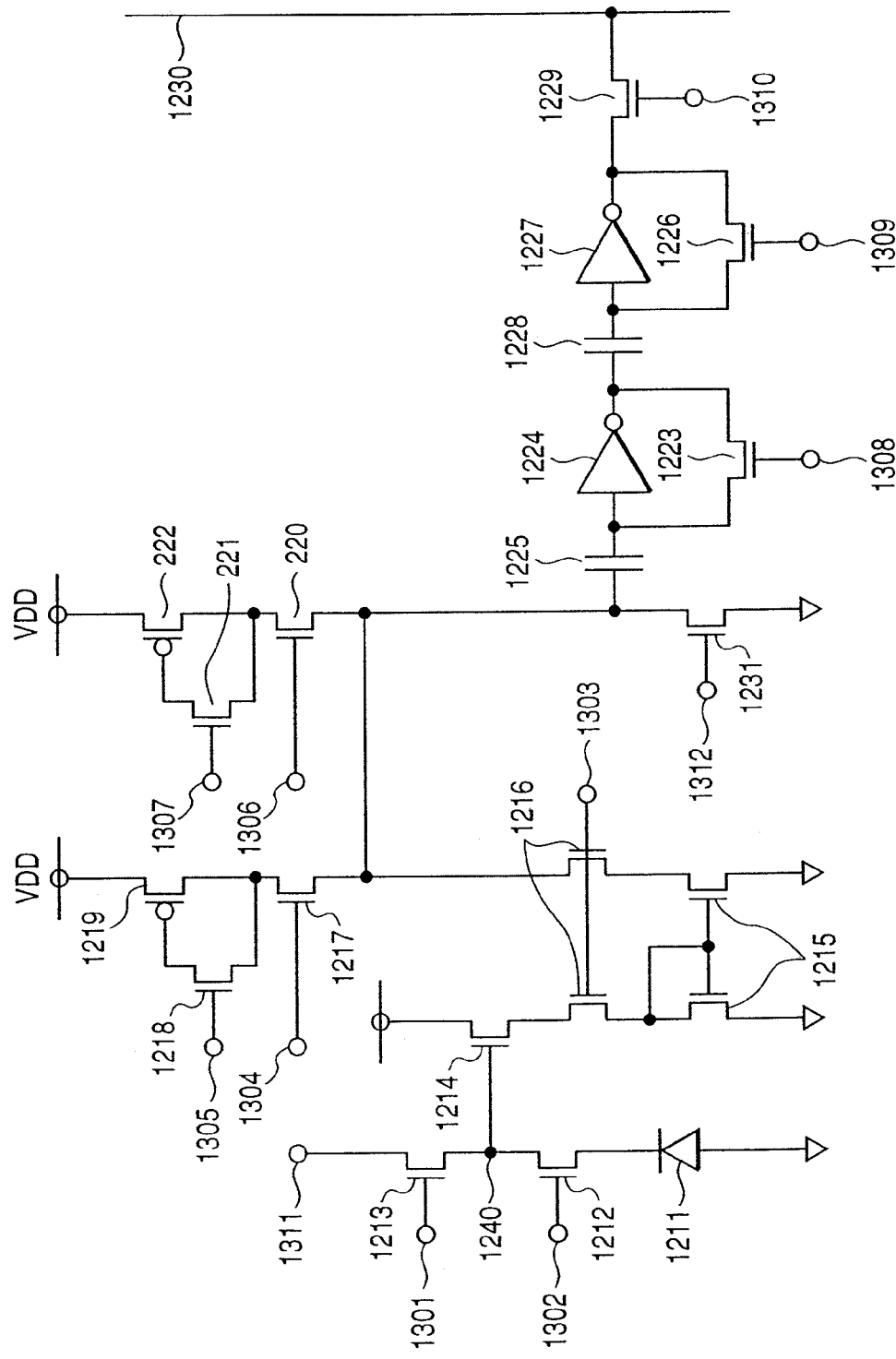
FIG. 23 is a diagram showing an example of the prior art.
Figure 24:
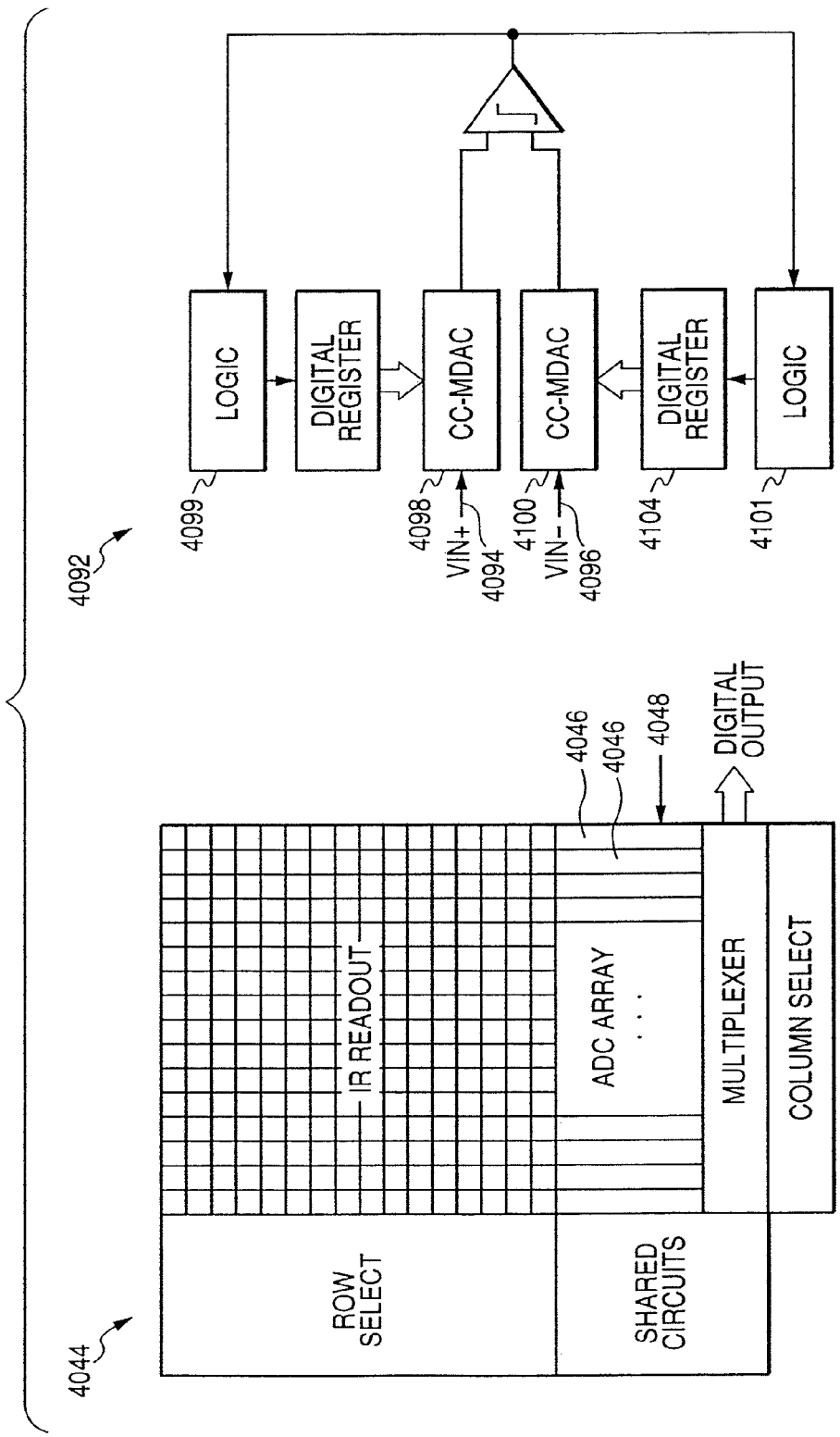
FIG. 24 is a diagram showing an example of the prior art.

The configuration of the present embodiment is particularly preferred in image sensors. In image sensors using lamp-type A/Ds such as explained with FIG. 22, factors such as the A/D conversion precision and the larger size of chips required in image sensors made it difficult to shorten the unit time for each step, and thereby makes it difficult to increase speed in further multi-bit enhancement. This is due to the fact that, since a triangular wave is supplied to the entire sensor face as an analog voltage, it is difficult on principle to shorten the duration of each step beyond a certain duration determined by a RC time constant, required to stabilize the triangular wave output throughout the entire chip. Therefore, when the number of steps is increased due to further multi-bit enhancement, it was difficult to achieve faster speed by shortening the duration of each step.

By using the configuration of the present embodiment, the integrators inside each A/D converter performs A/D conversion using a fixed voltage V_DE applied to its entirety, thereby eliminating the need to provide a waiting period for the stabilization of the lamp voltage, resulting in shortening the time for each step as compared to the method using a lamp voltage described above, and therefore shortening the time required for A/D conversion itself.

While a buffer with a gain of 1 was used for buffer 105, a voltage amplifying buffer with a gain of more than 1 can be used. It is also possible to incorporate a voltage amplifying function into a CDS when amplifying voltage. By amplifying voltage in this fashion, it is possible to reduce the input quantization value of noise superimposed in the signal after amplification. In addition, voltage amplification may include gains of 1 or less.

Also, in an actual circuit, an initial value will be determined by an output impedance of an integrator, and a resistive division which will be decided by an output impedance of the buffer 105. In response to this, methods such as lowering the output impedance of the buffer, or configuring a circuit that clips the maximum value by using a buffer with a capacitance-added source follower at its final stage, may be used.

Additionally, one A/D converter may be provided per 2 or more columns. The number of columns for which one A/D converter will be provided is a design issue determined by the permissible chip-like circuit size and the A/D conversion speed.

The above explanation was for a one-dimensional line operation. Next, a two-dimensional operation will be explained with reference to FIGS. 3 through 5.

FIG. 3 shows a simplest example wherein a series of operations consisting subtracting reset level at CDS at 301, A/D conversion at 302, and external output of digital data obtained as a result of the A/D conversion at 303, is repeated for each row. By introducing this method, although high-speed operation will be sacrificed, an A/D conversion with low noise will be possible.

301 is the period of time from the moment a signal output from a sensing element is input to CDS 120, to the moment when an output of CDS 120 is applied to an output 112 of an integrator and switch 106 is turned off. 302 is the period of time from time point 202, when switch 109 is turned on, to the moment (time point 204) when an A/D conversion result is loaded into a memory unit 116. 303 is the period of time for the A/D conversion results to be externally output sequentially via a buffer 119 from the arranged memory units 116.

FIG. 4 shows a method for increasing speed, and involves subtracting a reset level at CDS while outputting the A/D conversion result of the Nth row. By multiplexing the operation, it is possible to improve the A/D conversion throughput as well as the image data readout throughput. In addition, it is also possible to reduce the noise to a negligible level through design.

FIG. 5 shows a method for further increasing speed, and involves outputting the A/D conversion result of the Nth row at 502 while performing an A/D conversion of the N+1th row at 501, and performing the CDS of the N+2th row at 503. This enables an improved A/D conversion throughput compared to the circuit operation shown in FIG. 4, and enables high-speed readout of image data.

Figure 9:
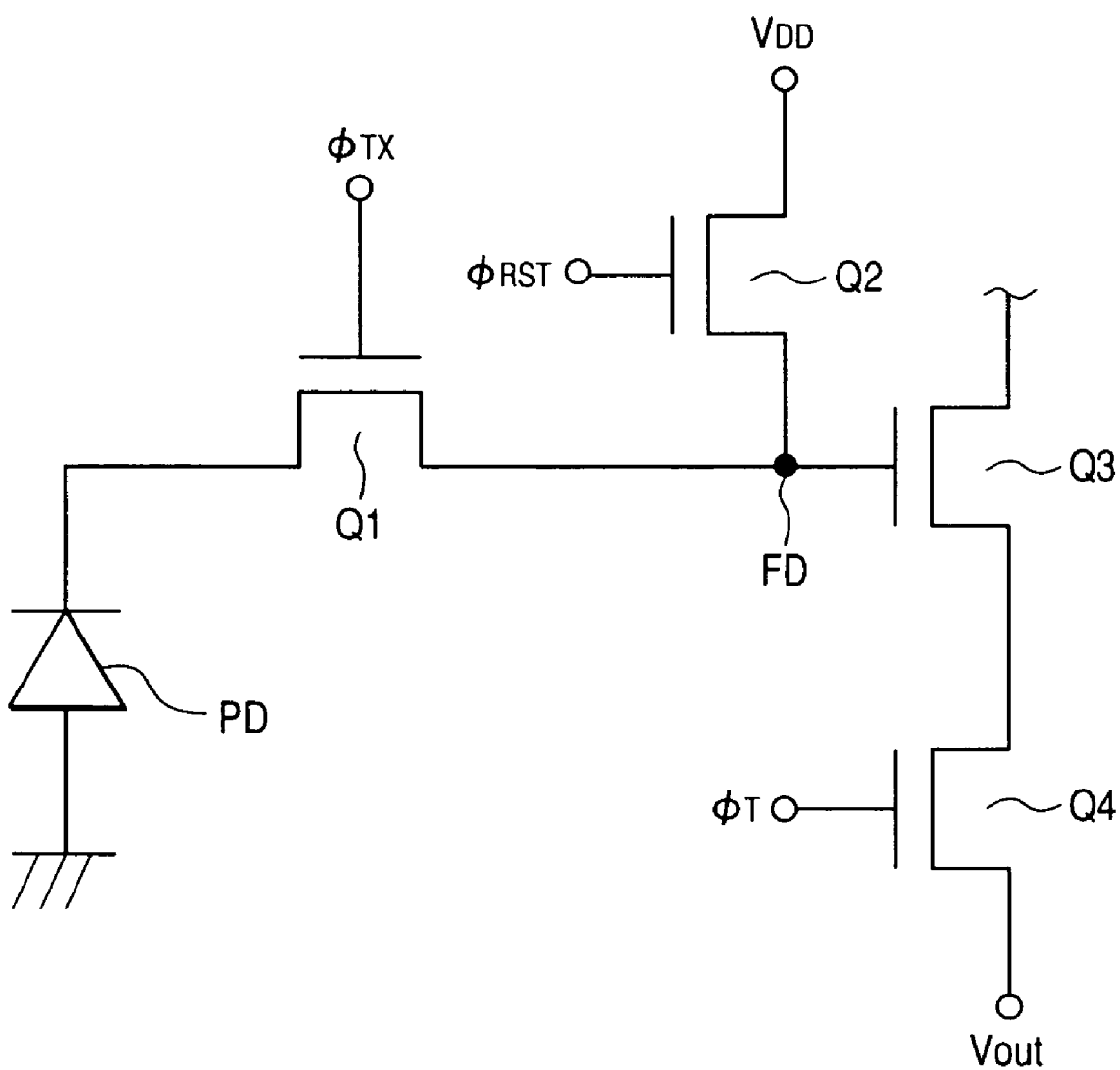
FIG. 9 is a diagram showing a pixel of a CMOS sensor.

FIG. 9 shows an exemplary configuration which uses photoelectric conversion pixels for sensing elements. The pixel shown in FIG. 9 is a pixel of a CMOS sensor.

In FIG. 9, PD is a photodiode, Q1 is a transmitting MOS transistor which transmits electric charges accumulated in the photodiode to a floating diffusion (FD) region, Q2 is a resetting MOS transistor which resets the FD region, Q3 is an amplifying transistor, and Q4 is a selecting MOS transistor.

The FD region is reset by setting signal φRST as the high-level and turning on the resetting MOS transistor Q2, and is output via selecting MOS transistor Q4 as a noise signal N. Then, setting signal φTX as the high-level, the electric charge accumulated in the photodiode PD is read out into the FD region via transmitting MOS transistor Q1. Signal electric charge $Q_{sig}$ is voltage-converted into $Q_{sig}/C_{FD}$ by capacitor $C_{FD}$ of the floating diffusion region FD, and the signal is amplified by the amplifying MOS transistor which has its gate connected with the floating diffusion region FD, and a signal S is read out from the selecting MOS transistor. The noise signal N is subtracted from the signal S by a CDS circuit. Such pixels are arranged in a matrix to configure the pixel portion 102 of FIG. 1. For each pixel of each pixel row, a gate of the transmitting MOS transistor Q1 is connected to a common transmission line, and a gate of the resetting MOS transistor Q2 is connected to a common reset line, and a gate of the selecting transistor Q4 is connected to a common selection line, and by a vertical scanning circuit (not shown), φRST, φTX and φT of each row are sequentially and respectively applied to a reset line, transmitting line and a select line provided for each row. Thus, the signal transmitting operation, reset operation and pixel selection operation (signal output operation) can be controlled per row. Furthermore, the configuration may be altered to connect a plurality of photodiodes to a gate of an amplifying transistor Q3 via a plurality of transmitting transistors, and to commonly use the amplifying transistor and the resetting transistor.

Figure 6:
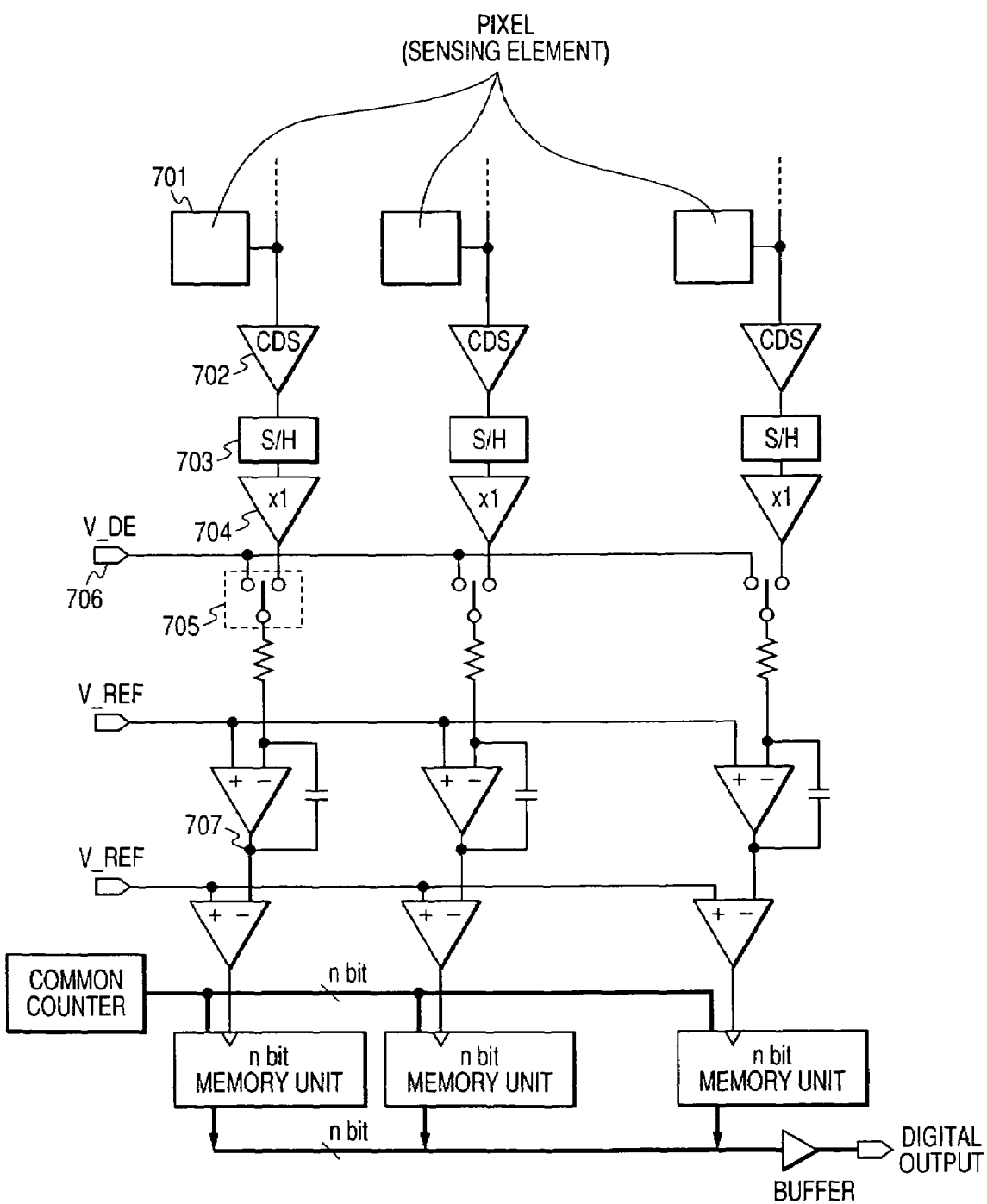
FIG. 6 is a diagram showing an example of a circuitry according to a second embodiment of the image pickup device of the present invention.

FIG. 6 is a diagram showing a second embodiment of the present invention. While the first embodiment involved directly writing on the value of the pixel signal to the output of the integrator, the second embodiment integrates both the pixel signal and a reference voltage.

An output from pixel 701 is removed of its reset level at the CDS circuit 702, maintained at sample holding (S/H) circuit 703, and input to an integrator via a buffer 704 and a switch 705. At the switch 705, the input of the integrator can be switched from a signal from the pixel to a fixed voltage (V_DE) for integration 706. Reference numeral 707 denotes an output portion of the integrator.

Figure 7:
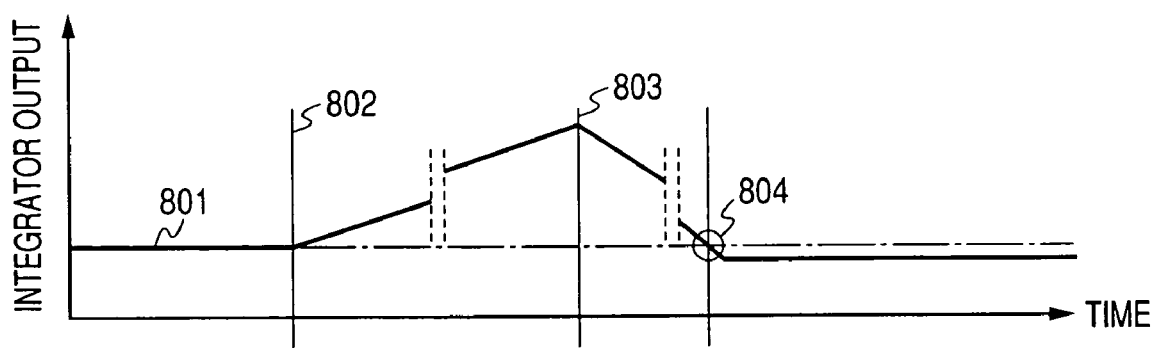
FIG. 7 is a diagram showing an example of an operation according to the second embodiment of the image pickup device of the present invention.

Next, circuit operation will be explained with reference to FIG. 7. FIG. 7 shows the change of the signal of the output portion 707 of the integrator over time. First, the integrator is reset at time period 801 to initialize output to V_REF, and then at time point 802, the switch 705 is switched from floating to the signal from the pixel to integrate the input voltage. By integrating the input signal over a certain period of time, the tidemark 803 will be determined by the sole parameter of input signal strength.

Then, by switching the switch 705 to the reference voltage side, integration is commenced with a negative gradient in the direction of V_REF. At that time the common counter starts counting. When the output of the integrator intersects with V_REF at 804, a trigger signal is sent to the memory and the value of the counter is latched.

The advantages of this embodiment are as follows. In the first embodiment, there is an advantage that the time per unit step can be shortened. The second embodiment shares this advantage.

In the first embodiment, the input signal is not integrated, and discharge is performed using a fixed voltage and a fixed RC time constant, and the discharge time is measured. Therefore, deviances in discharging characteristics occur when there are deviances in the RC time constant, resulting in possible variations of A/D conversion among columns.

In particular, in image sensors, the influences of such variations among columns are visibly manifested in the images, and it is desirable to inhibit such variations as much as possible. In this embodiment, since both input and output are integrated using the same integrator and the same RC time constant, it is possible to nullify any existing errors among the RC time constants of the ADC of each row.

Figure 8:
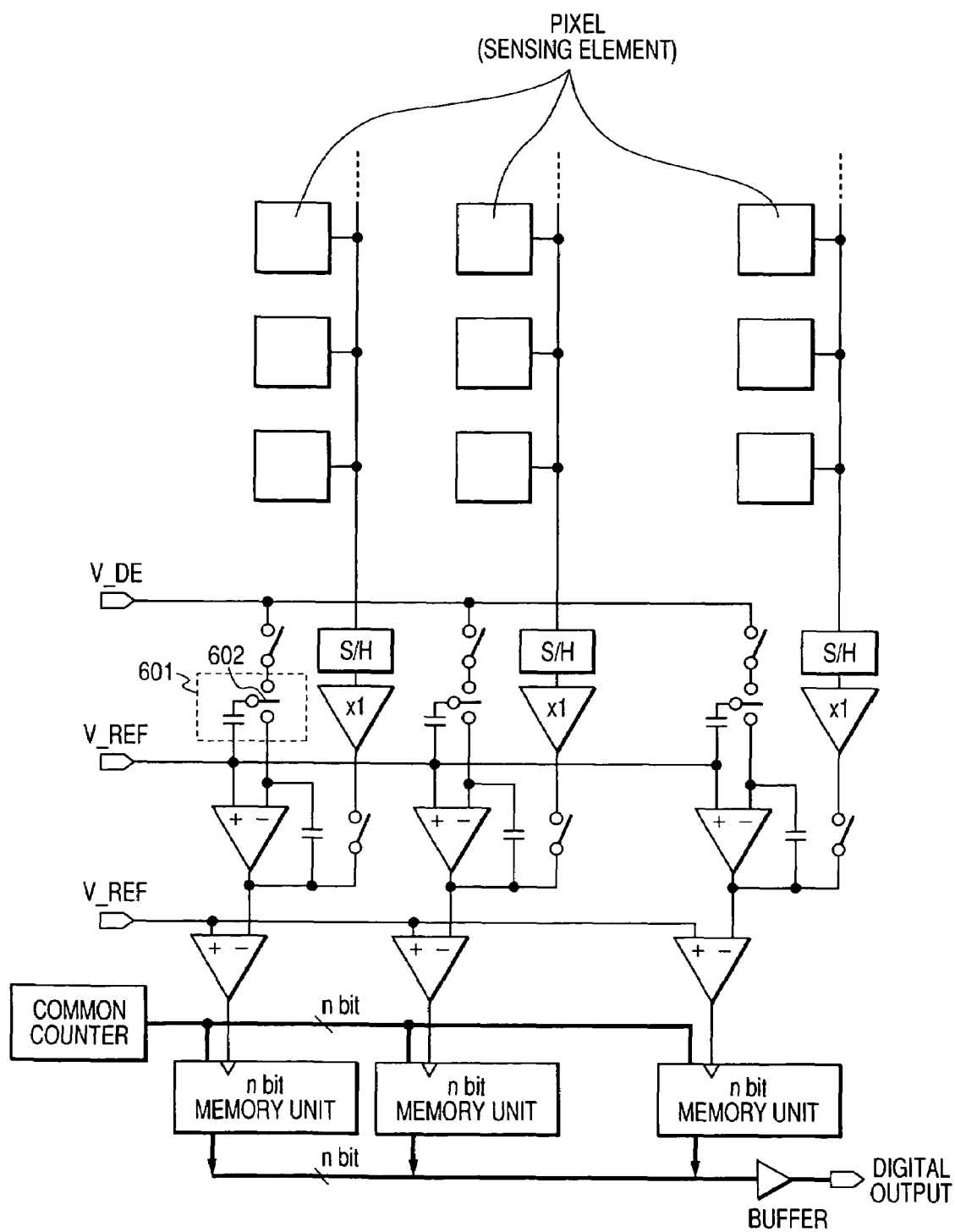
FIG. 8 is a diagram showing an example of a circuitry according to a third embodiment of the image pickup device of the present invention.

FIG. 8 shows a third embodiment of the present invention. With the exception of a switched capacitor 601, the configuration is the same as in FIG. 1. Integrator operation is realized by operating the switched capacitor 601 as a resistor that is equivalent to the resistor 108 in the first embodiment, while switching the switch 602.

The operation as a line and a two-dimensional sensor when using this circuit is pursuant to the first embodiment. The advantage gained over the first embodiment is that while the RC time constant of an integrator will assume a fixed value when using a resistor, various resistance values can be achieved when using a switching capacitor by switching the frequency of the switch. This enables a greater freedom in design, and makes it possible to respond to a wide variation of image signals brought about by various situations.

Fourth Embodiment

Figure 10:
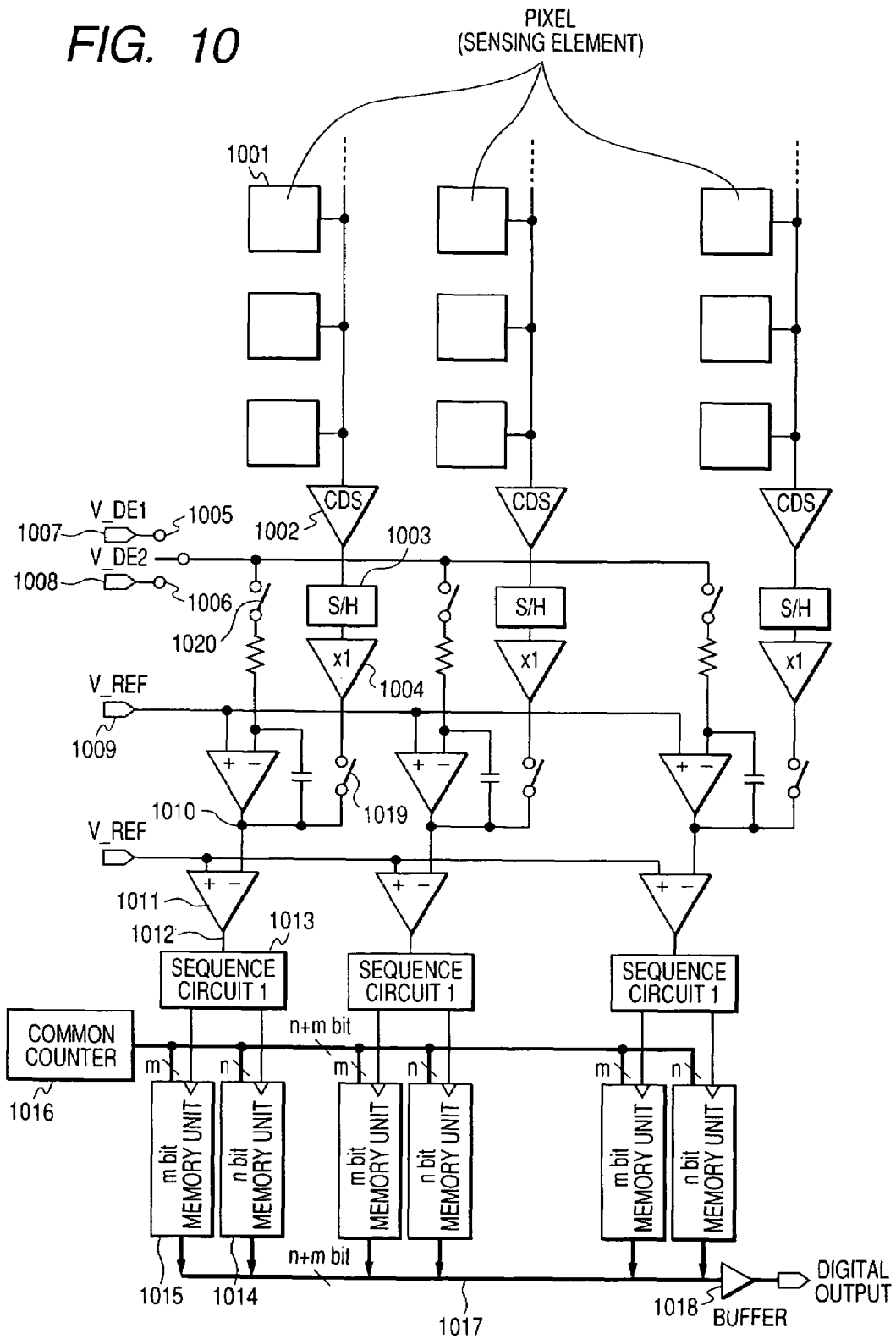
FIG. 10 is a diagram showing an example of a circuitry according to a fourth embodiment of the present invention.

FIG. 10 shows a fourth embodiment of the present invention. In this and all subsequent embodiments, switches, operational amplifiers etc. will be shown in their modelized forms, unless otherwise required. In addition, switches and other devices necessary for peripheral operation are also omitted unless otherwise required. It is needless to say that the embodiments are by no means limited to the examples described below.

An object of the fourth embodiment is to substantially reduce the number of comparison steps required for an A/D conversion of N bits from 2 to the Nth power times. Another object is to shorten the time per step and significantly increase comparison speed by eliminating the need to apply an analog triangular wave, as was the convention, and adopting a method wherein a fixed voltage is supplied to all A/D converters. Yet another object is to achieve substantial simplification of the circuit size by using a method that eliminates the need for exclusive DACs as was required in conventional image sensors using successive approximation-type A/D converters.

In FIG. 10, reference numeral 1001 denotes a pixel, and an output of pixel 1001 is connected to an output terminal 1010 of an integrator via a CDS (correlated double sampling) circuit 1002, a sample holding (S/H) circuit 1003, a buffer 1004 and a switch 1019.

By switching switches 1005 and 1006, two fixed voltages with different values, V_DE1 and V_DE2, from terminals 1007 and 1008 will be applied via a resistor and a switch 1020 to an input terminal (negative) of the integrator. A reference voltage 1009 will be applied to the other input terminal (positive) of the integrator. The fixed voltage V_DE1 is at a lower potential than reference voltage 1009 of the integrator, while the fixed voltage V_DE2 is at a higher potential than reference voltage 1009.

The integrator has a fixed RC time constant, and the integration output 1010 is thresholded at a comparator 1011. A trigger output 1012 of the comparator 1011 controls the data loading timing of a memory unit 1014 which retains high n bits, or a memory unit 1015 which retains low m bits, through a sequential circuit 1013. A common counter 1016 is connected to inputs of both memory units.

These memory units are selectively connected to a common horizontal signal line 1017, and are digitally output externally via a buffer 1018.

There are many methods to achieve selective output of the horizontal digital signal line 1017 from the memory units, including a method wherein ON/OFF terminals of each switch is first made controllable, and an external ON signal is applied only to the terminal that is desired to be turned ON. Other methods include, in order to avoid a drastic increase in the number of terminals necessary in the above method, a method wherein a signal is first encoded by a controller and then applied to a chip where it is decoded to control the ON/OFF of a switch, and a method wherein a device called a digital shift register is used to propagate an ON signal one column at a time.

Next, the operation of this circuit will be explained with reference to FIG. 11. A switch 1019 is turned on (ON), and an output of an integrator is set to a signal voltage 1102 of a pixel at time point 1101. Then, the switch 1019 is turned off (OFF) while switches 1005 and 1020 are turned ON (a counter commences counting when switch 1020 is turned ON), and integration is commenced at a negative gradient. At a given time point 1103, the output of the integrator becomes lower than a comparison voltage, and the counter value is loaded into memory unit 1014 which retains high n bits, thereby concluding the A/D conversion of high n bits. At the conclusion of the A/D conversion, the switch 1020 is turned off (switch 1020 is controlled by an output of a sequential circuit 1013) to interrupt integration. However, since the switch is discrete-time controlled (controlled by a digitally set time), the difference between the output of the integrator and the comparison voltage will not become 0, but instead a potential difference of V_DIFF 1104 will exist.

In the next step, conversion of the low m bits is performed by reintegrating first comparison potential difference V_DIFF 1104. Specifically, switches 1006 and 1020 are turned on (ON), and V_DE2 is applied to the integrator. Since V_DE2 is at a higher potential than a reference voltage V_REF of the integrator, the next integration proceeds at a positive gradient in relation to time. At time point 1105, the reference voltage of the comparator and the output of the integrator once again intersect, and a trigger is sent to a memory unit, and the counter value is loaded into the memory unit 1015 which retains low m bits, thereby concluding the A/D conversion of low m bits.

The configuration of the present embodiment is particularly preferred in image sensors. When mounting high-precision A/D converters in columns in a parallel arrangement onto an image sensor, due to restrictions in layout, it was necessary to keep circuit size at a minimum. Successive approximation-type A/D converters and lamp-type A/D converters which required a large number of steps were unable to meet this need.

Using this configuration, by dividing 12 bits into, for instance, high 6 bits and low 6 bits, the number of steps can be drastically reduced to 128 comparison steps compared to conventional lamp-type A/D converters. In addition, in regards to circuit size, unlike conventional lamp-type A/D converters the only circuit configuration element that is needed to be added is an integrator, thereby keeping increase of circuit size to a minimum. Even in comparison to successive approximation-type A/D converters, it is no longer necessary to use high-precision DACs, enabling reduction in circuit size.

Also, by using the configuration of the present embodiment, the integrators inside each A/D converter perform A/D conversion using fixed voltage V_DE1 and V_DE2 which are applied to its entirety, thereby eliminating the need to provide a waiting period for the stabilization of the triangular wave (lamp voltage), resulting in shortening the time for each step as compared to a lamp-type. A/D converter, and therefore shortening the time required for the A/D conversion itself.

Additionally, while a buffer with a gain of 1 was used, a voltage amplifying buffer with a gain of more or less than 1 can be used. Similarly, the gain can be made variable, or adaptively controllable in response to a signal from a pixel. A gain of 1 or more will result in an advantage of reducing input quantization noise generated after buffer, while a gain of 1 or less will result in an advantage of increasing the input dynamic range of the A/D converter. These are design issues to be determined by specification.

Furthermore, while pixel noises are removed by CDS in the present embodiment, this may not be required for certain specifications and pixel types, and therefore may be removed. In addition, any CDS method among many can be used. This is self-evident from the fact that the CDS configuration does not directly contribute to the advantages provided by the present invention.

Also, the gradient of the integration in a positive voltage direction and a negative voltage direction is controlled by two fixed voltages, V_DE1 and V_DE2. Their values are one of the design parameters determined by time allowed for A/D conversion, as well as required precision.

Additionally, while a N bit conversion was performed by dividing it into high n bits and low m bits, where N=n+m, it is also possible to divide it, for instance, into 3 parts, where the bits are sorted into high bits, middle bits and low bits, where N=1+n+m. In this case, it is necessary to add a new integration voltage, and the respective voltage values should be arbitrarily changed.

Figure 11:
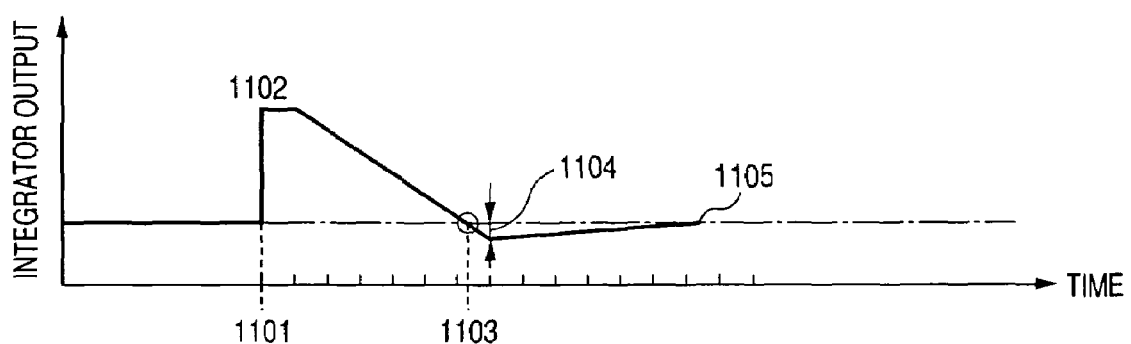
FIG. 11 is a diagram showing an example of an operation according to the fourth embodiment of the present invention.

Furthermore, in the operational diagram shown in FIG. 11, conversion of the low bits was commenced immediately upon conclusion of the conversion of the high bits. However, since the counter 116 operates synchronously through the entire sensor, when performing conversion with a plurality of columns, even when a conversion of the high bits of a column is concluded, the process waits for the conclusion of the high bits of all columns (when differences in high bits conversions occur between columns, the process waits for the high bits conversion of all column to finish), before shifting to the conversion of low bits.

While the above is a description of a one-dimensional line operation, a two-dimensional operation will next be explained with reference to FIGS. 12 through 14. FIG. 12 shows a simplest example wherein, for each line, a reset level is subtracted by CDS at 1201, an A/D conversion is performed at 1202, and a digital data of the A/D conversion result is output externally at 1203, and the operation repeats itself for every line. By using this method, A/D conversion with a low noise level is possible.

Reference numeral 1201 denotes the period of time from the moment a signal output from a sensing element is input to CDS 1002, to the moment when an output of CDS 1002 is applied to an output 1010 of an integrator and a switch 1019 is turned off. 1202 is the period of time from time point 1102, when switches 1005 and 1020 are turned on to commence integration and high n bit data is loaded to a memory unit 1014, to the moment (time point 1105) when switches 1006 and 1020 are turned on to commence integration and low m bit data is loaded to a memory unit 1015. 1203 is the period of time for the A/D conversion results for the n+m bits to be externally output sequentially via a sequential buffer 1018 from the arranged memory units 1014 and 1015.

FIG. 13 shows a method for increasing speed, wherein reset level is subtracted at CDS while outputting the A/D conversion results for the Nth row. By multiplexing the operation, it is possible to improve the A/D conversion throughput as well as the image date readout throughput. In addition, it is also possible to reduce the noise to a negligible level through design.

Figure 14:
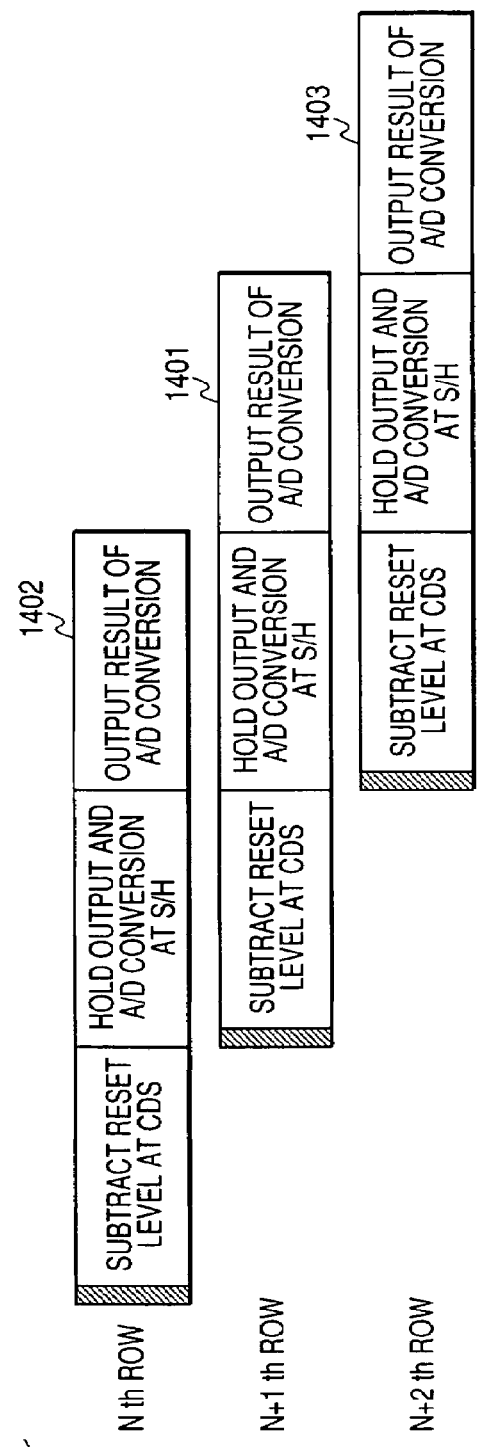
FIG. 14 is a diagram showing an example of an operation according to the fourth embodiment of the present invention.

FIG. 14 shows a method for further increasing speed, and involves outputting the A/D conversion result of the Nth row at 1402 while performing an A/D conversion of the N+1th row at 1401, and performing the CDS of the N+2th row at 1403. This enables an improved A/D conversion throughput compared to the circuit operation shown in FIG. 13, and enables high-speed readout of image data.

Various operation modes have been exemplified in FIGS. 12 through 14. However, possible operation modes are not limited to the examples shown.

FIG. 9 shows an exemplary configuration which uses photoelectric conversion pixels for sensing elements. The pixel shown in FIG. 9 is a pixel of a CMOS sensor.

In FIG. 9, PD is a photodiode, Q1 is a transmitting MOS transistor which transmits electric charges accumulated in the photodiode to a floating diffusion (FD) region, Q2 is a resetting MOS transistor which resets the FD region, Q3 is an amplifying transistor, and Q4 is a selecting MOS transistor.

The FD region is reset by setting signal φRST as the high-level and turning on the resetting MOS transistor Q2, and is output via selecting MOS transistor Q4 as a noise signal N. Then, setting signal φTX as the high-level, the electric charge accumulated in the photodiode PD is read out into the FD region via transmitting MOS transistor Q1. Signal electric charge $Q_{sig}$ is voltage-converted into $Q_{sig}/C_{FD}$ by capacitor $C_{FD}$ of the floating diffusion region FD, and the signal is amplified by the amplifying MOS transistor which has its gate connected with the floating diffusion region FD, and a signal S is read out from the selecting MOS transistor. The noise signal N is subtracted from the signal S by a CDS circuit. Such pixels are arranged in a matrix to configure the pixel portion 1001 of FIG. 10. For each pixel of each pixel row, a gate of the transmitting MOS transistor Q1 is connected to a common transmission line, and a gate of the resetting MOS transistor Q2 is connected to a common reset line, and a gate of the selecting transistor Q4 is connected to a common selection line, and by a vertical scanning circuit (not shown), φRST, φTX and φT of each row are sequentially and respectively applied to a reset line, transmitting line and a select line provided for each row. Thus, the signal transmitting operation, reset operation and pixel selection operation (signal output operation) can be controlled per row. Furthermore, the configuration may be altered to connect a plurality of photodiodes to a gate of an amplifying transistor Q3 via a plurality of transmitting transistors, and to commonly use the amplifying transistor and the resetting transistor.

Fifth Embodiment

Figure 15:
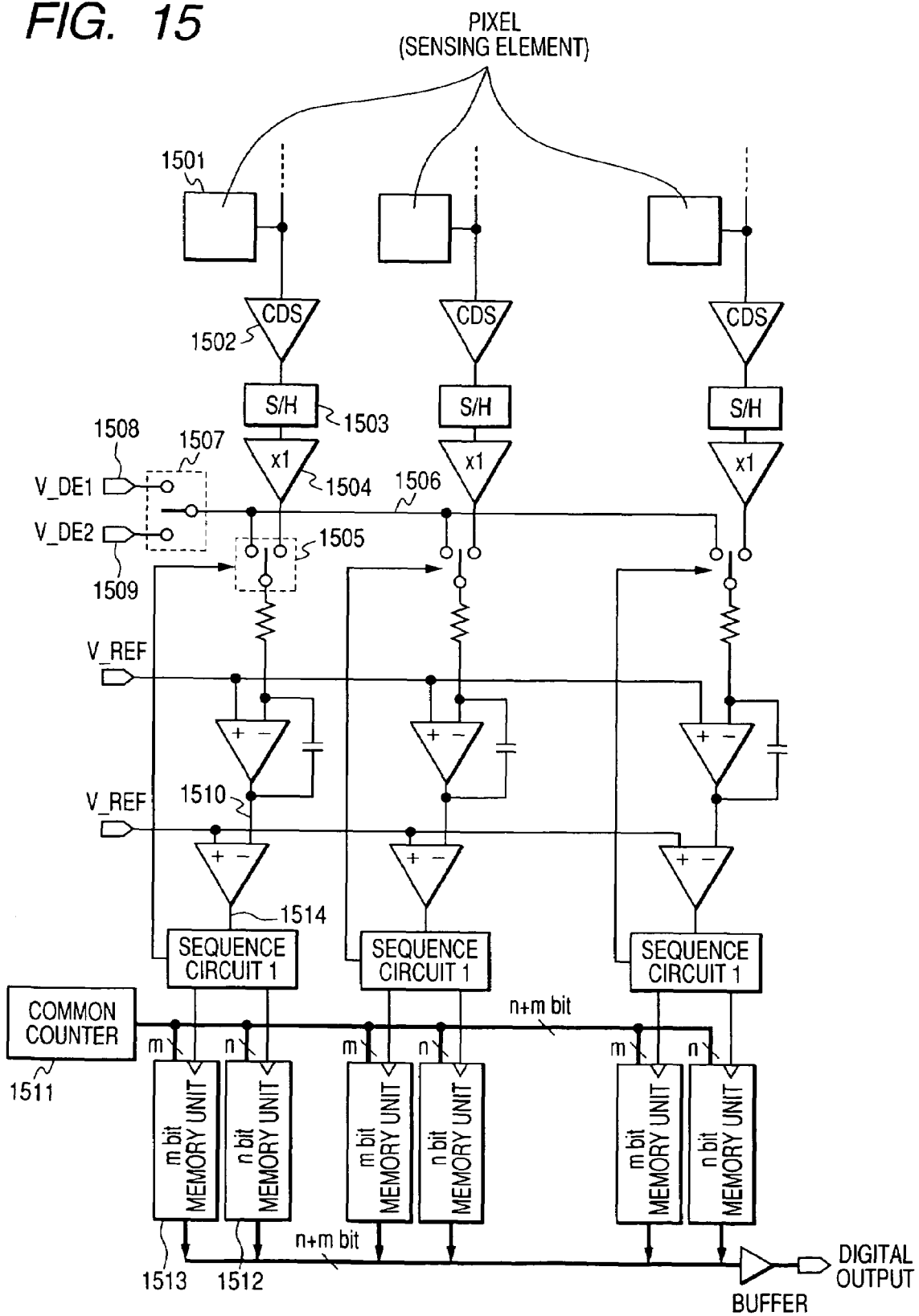
FIG. 15 is a diagram showing an example of a circuitry according to a fifth embodiment of the present invention.

FIG. 15 is a diagram showing a fifth embodiment of the present invention. While the fourth embodiment involved directly writing the value of the pixel signal to the output of the integrator, the present embodiment also integrates the pixel signal.

An output from pixel 1501 is removed of its reset level at a CDS circuit 1502, maintained at sample holding (S/H) circuit 1503, and input to an integrator via a buffer 1504 and a switch 1505. At switch 1505, the input of the integrator can be switched from a signal from the pixel or a fixed voltage for integration 1506.

Also, with switch 1507, the fixed voltage for integration can be set to two fixed voltages V_DE1 (1508) and V_DE2 (1509). Reference numeral 1510 denotes an output portion of the integrator. A counter 1511 is connected to a memory unit 1512 for retaining high bits (n bits), and a memory unit 1513 for retaining low bits (m bits), and the memory units latch the counter value after receiving a trigger from a comparator 1514.

Figure 16:
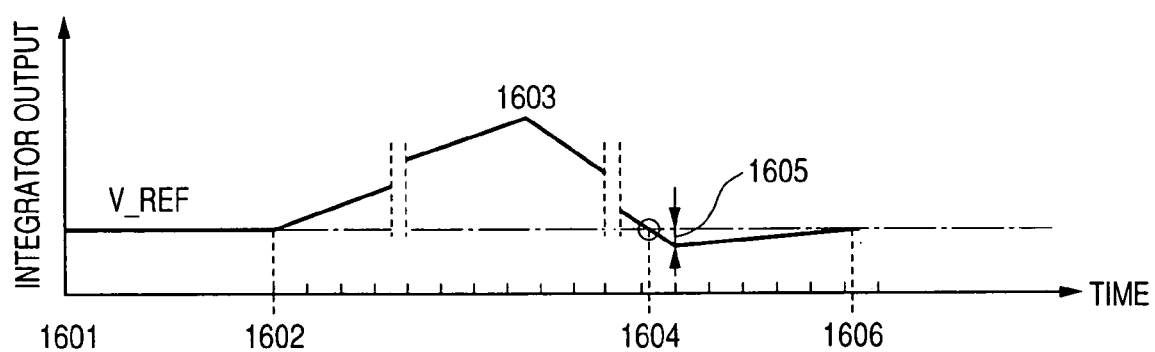
FIG. 16 is a diagram showing an example of an operation according to the fifth embodiment of the present invention.

Next, circuit operation will be explained with reference to FIG. 16. FIG. 16 shows the change of the signal of the output portion 1510 of the integrator over time. First, the integrator is reset at time period 1601 to initialize output to V_REF, and then at time point 1602, the switch 1505 is switched from floating to the signal from the pixel to integrate the input voltage. By integrating the input signal over a certain period of time, the tidemark 1603 will be determined by the sole parameter of input signal strength.

Then, by switching the switch 1505 to the reference voltage side, and setting a switch 1507 to the V_DE1 side, the integration is commenced with a negative gradient in the direction of V_REF. When the output of the integrator intersects with V_REF at time period 1604, a trigger signal is sent to the memory where the high n bits are latched.

As was the case in the fourth embodiment, since the counter 1511 and the switch 1505 are discrete-time controlled, a difference V_DIFF 1605 from the comparison voltage occurs. The conversion of the low bits is concluded by using V_DE2 to reintegrate with a positive gradient, and measuring the time 1606 until the comparator is re-inverted.

The operation of the present embodiment as a two-dimensional sensor is the same as in the fourth embodiment.

With the present embodiment, the following improvements can be achieved while retaining all the advantages of the fourth embodiment. In the fourth embodiment, the input signal is not integrated, and discharge is performed using a fixed voltage and a fixed RC time constant, and this discharge time is measured. Therefore, deviances in discharging characteristics occur when there are deviances in the RC time constant among the columns, resulting in possible variations of A/D conversion among columns.

In image sensors, the influences of such variations among columns are visibly manifested in the images, and it is desirable to inhibit such variations as much as possible. In the present embodiment, since both input and output are integrated using the same integrator and the same RC time constant, it is possible to nullify any existing errors among the RC time constants of the ADCs of each row.

Sixth Embodiment

Figure 17:
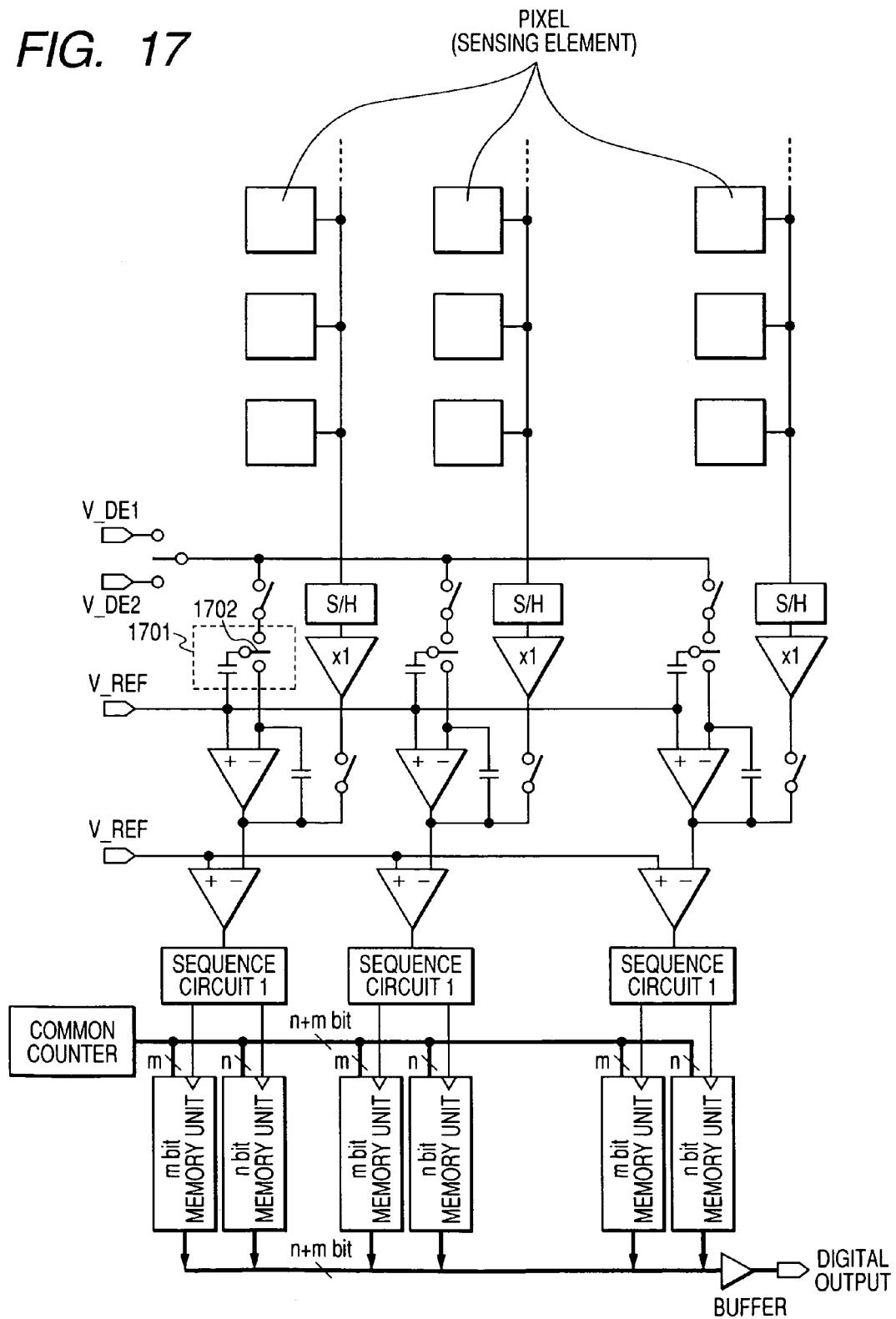
FIG. 17 is a diagram showing an example of a circuitry according to a sixth embodiment of the present invention.

FIG. 17 shows a sixth embodiment of the present invention. With the exception of a switched capacitor 1701, the configuration is the same as in FIG. 10. Integrator operation is realized by operating the switched capacitor 1701 as a resistor that is equivalent to a resistor, while switching the switch 1702.

The operation as a line and a two-dimensional sensor when using this circuit is pursuant to the fourth embodiment. The advantage gained over the fourth embodiment is that while the RC time constant of an integrator will assume a fixed value when using a resistor, various resistance values can be achieved when using a switching capacitor by switching the frequency of the switch. This makes it possible to switch operations in response to various uses.

Seventh Embodiment

A seventh embodiment of the present invention will next be explained with reference to FIG. 18. This circuit enables the use of low-sensitivity comparators by amplifying the remainder of the voltage used for the reintegration operation.

The specific operation is as follows. Since the emphasis of the explanation of the present embodiment is placed on its amplifying portion, pixels and other peripheral devices have been omitted. Such omitted portions are basically the same as the previous embodiments.

In this circuit, an output 1803 of an integrator 1808 is reset to V_REF after turning on a switch 1801 to nullify a capacitor Co (1802). Then, by switching switches 1805 and 1806, a signal V_PIX from a pixel applied to a terminal 1804 is input to the integrator 1808 via a buffer 1807.

The integrator 1808 comprises an operational amplifier 1814, a capacitor Cint (1809), and a capacitor Cr (1810), and its output terminal 1803 is connected to one of the input terminals (positive) of a comparator 1811. An input terminal (negative) of the operational amplifier 1814 is connected via a resistor to an output portion of the buffer 1807, and also to the other input terminal (negative) of the comparator 1811.

The comparator 1811 is further connected to an input terminal (positive) of a comparator 1812 to increase gain of the comparator. Also, the switch 1806 enables the output of the comparator 1811 to be fed back to the integrator. Reference numeral 1813 denotes a terminal to apply an integration voltage V_DE1. A reference voltage V_REF is applied to an input terminal (positive) of the operational amplifier 1814 and the other input terminal (negative) of the comparator 1812.

Figure 19:
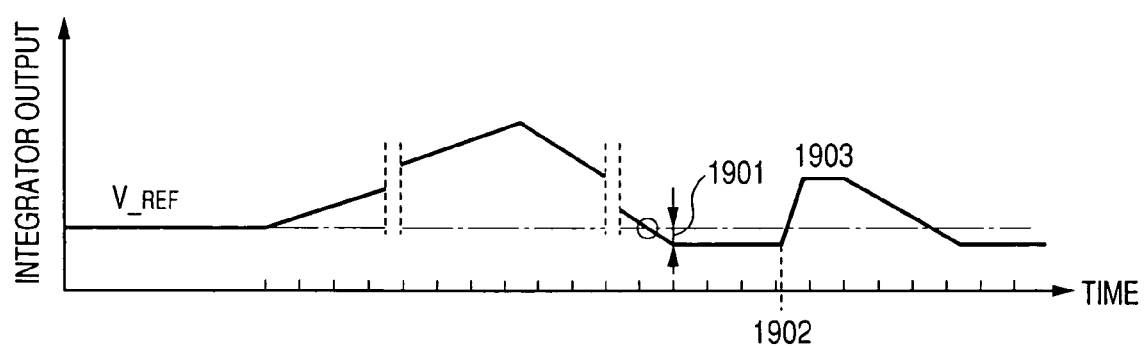
FIG. 19 is a diagram showing an example of an operation according to the seventh embodiment of the present invention.

The operation of the circuit will now be explained with reference to FIG. 19. The operations of integrating a signal from a pixel, and obtaining the result of a high bit conversion by integrating with V_DE1 are the same as in previous embodiments. Next, when repeating A/D conversion on a difference 1901, the switch 1801 is first thrown open at time 1902, and the switch 1806 is connected so that feedback is provided from an output of comparator 1811 to an input of the integrator. A virtual ground will be formed between an inverting input portion (negative) of the operational amplifier 1814 and an inverting input portion (negative) of the comparator 1811, and the electric charge of the capacitor 1810 will be retained in its entirety in the capacitor 1802. Therefore, the output of the integrator will ultimately be amplified to —(Cr/Co) times the difference 1901 between comparison voltages, and reaches 1903 of FIG. 19.

Next, the switches 1805 and 1806 are reconnected to the V_DE1 side, and the switch 1801 is thrown open to re-commence A/D conversion of the amplified difference. Since the difference has been inverse-amplified, the second integration operation should also be performed with a negative gradient, and the same polarity V_DE1 can be used for this purpose.

The conversion of the low bits will be concluded when the comparator is re-inverted, as is the case with other conventional examples.

In addition to the same advantages obtained with the various embodiments described above, the present embodiment additionally provides the following advantages. In converters using comparators such as those used in image sensors with conventional lamp-type A/D converters, there existed a problem in that higher determination accuracy was required for comparators when increasing the number of bits.

When increasing the number of steps, the voltage change per step is the amplitude of the triangular wave divided by the number of steps, or the change of the integration per step. For instance, when hypothesizing that the amplitude of the triangular wave is 1V at a conversion accuracy of 12 bit, an extremely high gain is required for the comparator in order to accurately determine 1V/4096, or 244 microvolts, thereby significantly increasing the difficulties in regards to circuit size and power consumption.

In the present embodiment, since the voltage of the remainder 1901 of the integration is amplified, a requirement for determination accuracy of the comparator is alleviated and the accuracy of A/D conversion is consequently improved.

In addition, depending upon the setting of gain during amplification of the difference, it is possible that the integral constant will not match when using the same V_DE1, and therefore preventing accurate A/D conversion. In such cases, it is possible to resolve the problem by using another different integration voltage, or replacing the resistor of the integrator with a variable resistor, or utilize the method of the third conventional example to make the switching frequency of the switched capacitor variable. These are all design issues.

Figure 18:
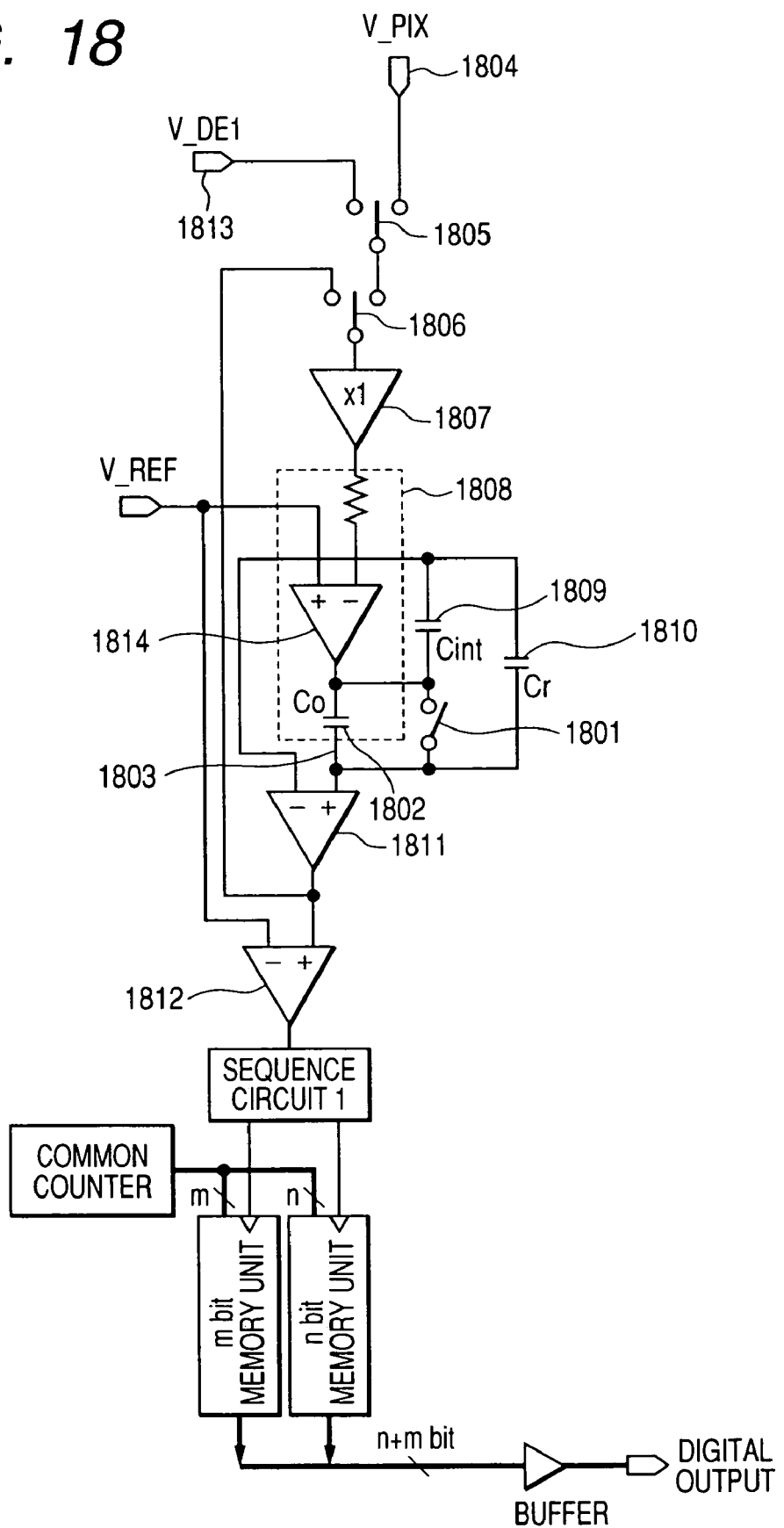
FIG. 18 is a diagram showing an example of a circuitry according to a seventh embodiment of the present invention.
Figure 20:
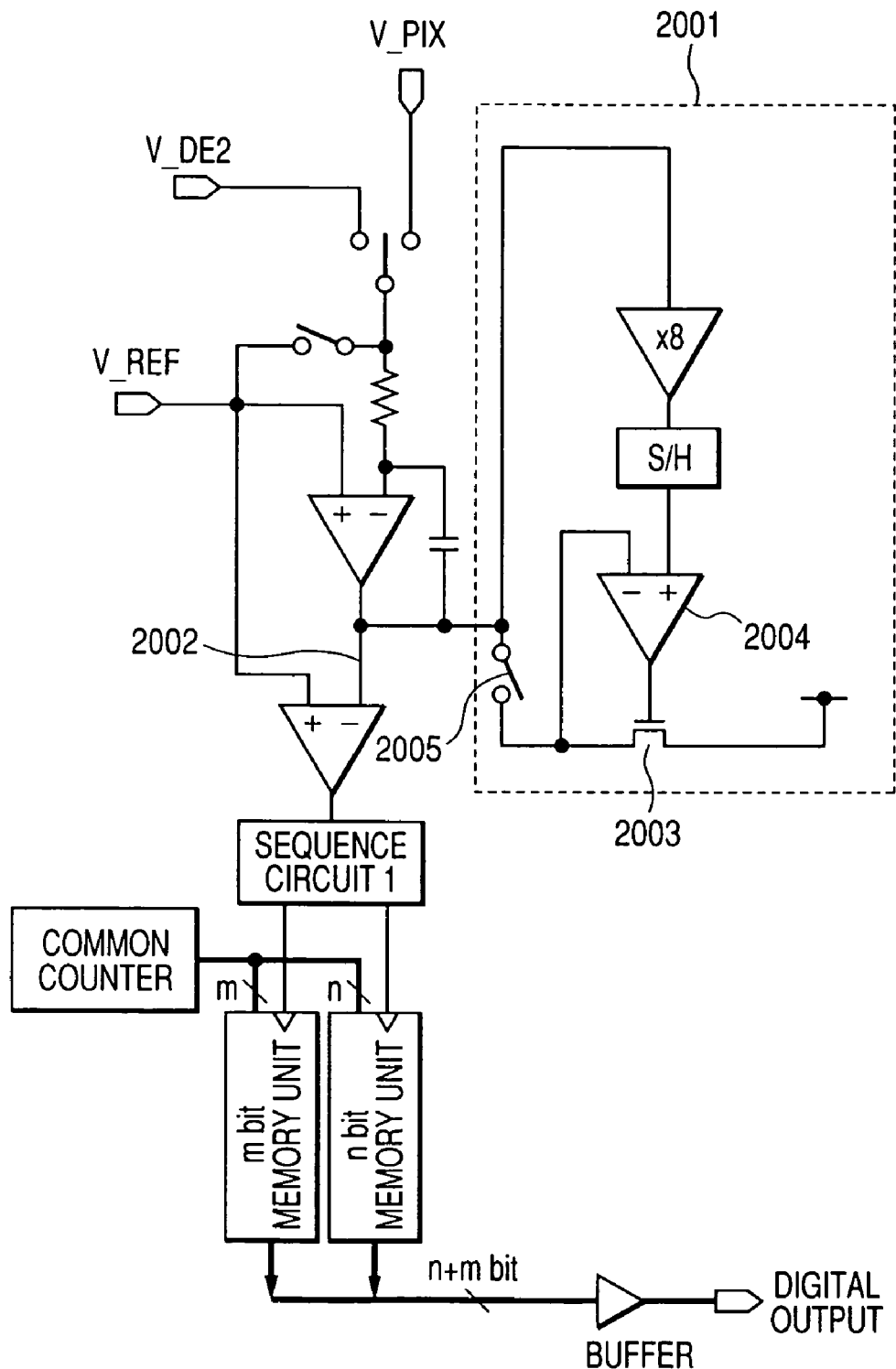
FIG. 20 is a diagram showing another example of a circuitry according to the seventh embodiment of the present invention.

FIG. 20 is a realization of the same amplification operation of a difference of the embodiment shown in FIG. 18, using a different circuit. Using circuit block 2001, the difference of an output 2002 of an integrator from a comparison reference voltage is inverse-amplified. In this example, an amplifier with a gain of –8 is used. A voltage follower comprising an nMOS transistor 2003 and an operational amplifier 2004 is connected via a switch 2005, making it possible to overwrite a terminal 2002 by an amplified voltage. While an nMOS transistor 2003 is used in order to prevent voltage change due to resistive division determined by the output resistances of two operational amplifiers, the operation is not limited to this method.

Using this method, basically the same advantages obtained with the circuit shown in FIG. 18 can be obtained. In addition, the method of voltage amplification can be chosen from a wide variety of methods, thereby enabling greater freedom in design.

An embodiment wherein a solid-state image pickup element according to the present invention is applied to a still camera will now be explained with reference to FIG. 21.

Figure 21:
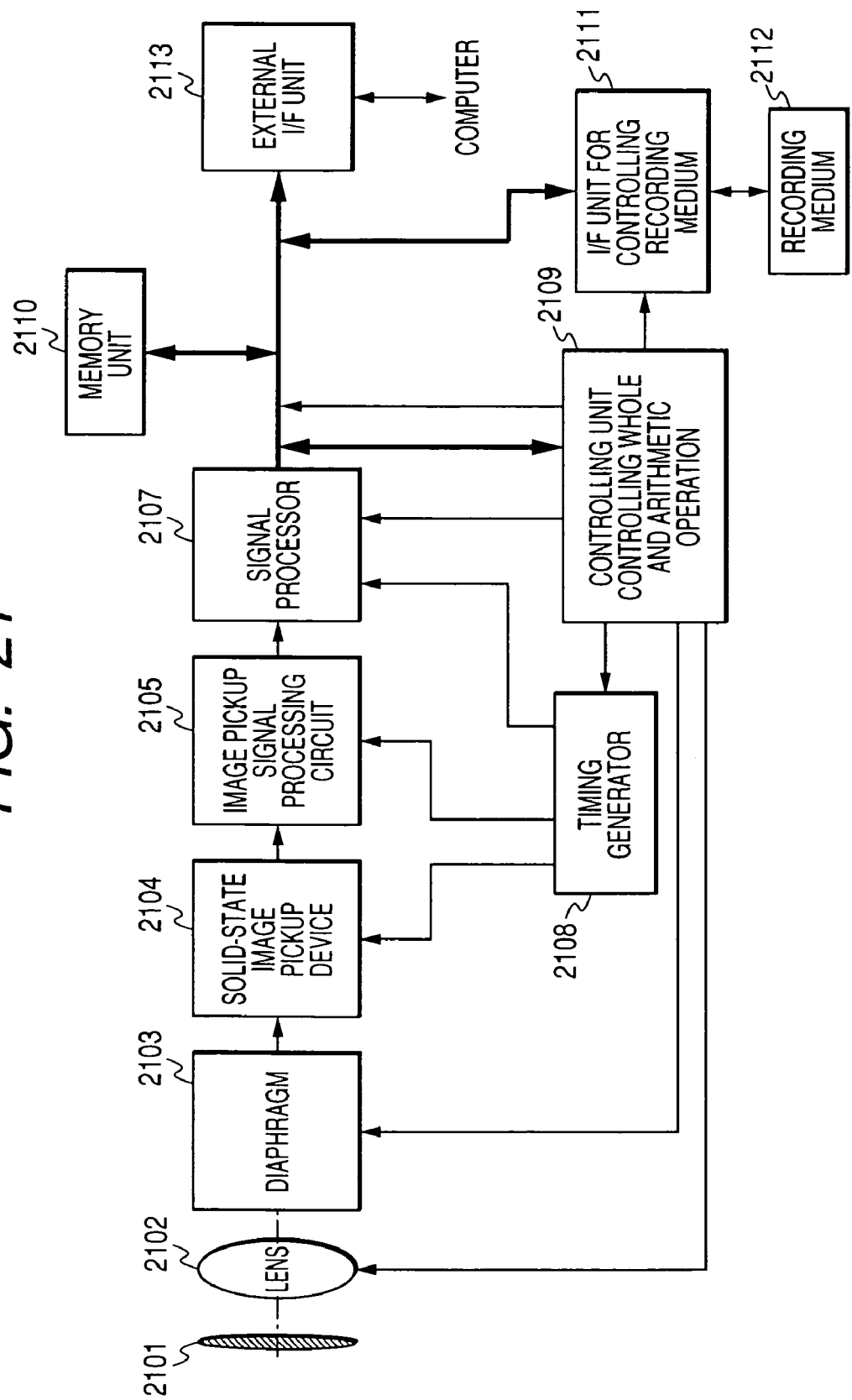
FIG. 21 is a block diagram illustrating an application of the image pickup device of the present invention to a "still video camera"

FIG. 21 is a block diagram showing an example of an image pickup device according to the present invention applied to a "still video camera".

In FIG. 21, reference numeral 2101 denotes a barrier which doubles as a means of protection for the lens and a main switch, reference numeral 2102 denotes a lens for providing an optical image of a subject on a solid-state image pickup element (image pickup device), reference numeral 2103 denotes diaphragm for variating the amount of light passing through the lens 2102, reference numeral 2104 denotes a solid-state image pickup element for loading as an image signal the image of the subject provided by the lens 2102, reference numeral 2107 denotes a signal processing unit which performs various corrections on the output image date and compresses data, reference numeral 2108 denotes a timing generation unit which outputs various timing signals to the solid-state image pickup element 2104, an image pickup signal processing circuit 2105, and the signal processing unit 2107, reference numeral 2109 denotes a controlling unit for controlling whole and arithmetic operation which controls various arithmetic operations as well as the entire still video camera, reference numeral 2110 denotes a memory unit to temporarily store image data, reference numeral 2111 denotes an interface unit to read from or write onto a recording medium, reference numeral 2112 denotes a detachable recording medium such as a semiconductor memory to read or write image data, and reference numeral 2113 denotes an interface unit to communicate with devices such as external computers.

Next, the operation during shooting of a still video camera according to the configuration described above will be explained.

When the barrier 2101 is opened, the main power is first turned on, followed by the power for the control system, and then by the power for the shooting system circuitry.

Then, in order to control the amount of exposure, the controlling unit for controlling whole and arithmetic operation 2109 opens the diaphragm 2103, and a signal output from the solid-state image pickup element 2104 is input to the signal processing unit 2107.

Based on this data, the controlling unit for controlling whole and arithmetic operation 2109 calculates exposure.

Brightness is determined by the result of a photometry, and the controlling unit for controlling whole and arithmetic operation 2109 controls the diaphragm based on the brightness.

Next, based on the signal output from the solid-state image pickup element 2104, a high-frequency component is extracted and the controlling unit for controlling whole and arithmetic operation 2109 calculates the distance to the subject. Then, the lens is driven to determine whether the subject is in or out of focus. When the subject is determined to be out of focus, the lens is re-driven to measure distance.

After in-focus is confirmed, main exposure is commenced.

After conclusion of exposure, the image signal output from the solid-state image pickup element 2104 passes through the signal processing unit 2107 and is written into the memory unit by the controlling unit for controlling whole and arithmetic operation 2109.

The data accumulated in the memory unit 2110 is controlled by the controlling unit for controlling whole and arithmetic operation 2109 which passes it through the recording medium controlling interface unit, and finally recorded onto a detachable recording medium 2112 such as a semiconductor memory.

The data may also be passed through an external interface unit 2113 to be input directly into a computer etc. for image processing.

This application claims priority from Japanese Patent Application Nos. 2004-168578 filed Jun. 7, 2004 and 2004-168579 filed Jun. 7, 2004, which are hereby incorporated by reference herein.

The invention claimed is:

1. An image pickup device comprising:
sensing elements arranged in a matrix;
a digital counter; and
an A/D converter provided for each column of said sensing elements,
wherein each A/D converter first retains in a memory unit as an initial value an electric signal corresponding to a signal of a corresponding sensing element, which is an analog signal, and said A/D converter then initiates charge or discharge of said memory unit at a rate corresponding to a magnitude of an input fixed signal, measures a time period from either a charge start time or a discharge start time until said electric signal of said memory unit becomes equal to a reference signal, and recognizes said measured time period as a digital value,
wherein each A/D converter includes an integrator, a comparator, and a digital memory,
wherein an output of said integrator is connected to an input of said comparator, an output of said comparator is connected to a loading trigger terminal of said digital memory, and
wherein said digital counter is connected to an input terminal of said digital memory, and output from said digital counter is stored in said digital memory is the digital value.

2. The image pickup device according to claim 1, wherein said initial value is determined by integrating for a certain period of time said signal of said corresponding sensing element with said integrator, and a determined initial value is either charged or discharged using said integrator.

3. The image pickup device according to claim 2, wherein said memory unit is an output portion of said integrator.

4. The image pickup device according to claim 1, wherein said integrator includes an operational amplifier, a resistor connected to an input terminal of said operational amplifier, and a capacitor connected between said input terminal and an output terminal of said operational amplifier.

5. The image pickup device according to claim 1, wherein said integrator includes an operational amplifier and a switched capacitor circuit, which is connected to an input terminal of said operational amplifier.

6. The image pickup device according to claim 1, wherein sensing elements arranged in a column direction are selectively connected to a vertical output line, and said vertical output line and a corresponding A/D converter are connected via a voltage amplifier.

7. The image pickup device according to claim 1, wherein sensing elements arranged in a column direction are selectively connected to a vertical output line,
said vertical output line and a corresponding A/D converter are connected via a noise reduction circuit, and
said noise reduction circuit has a function to reduce a noise signal of said signal from said sensing element after sensing.

8. The image pickup device according to claim 1, wherein reading of a row is commenced prior to conclusion of outputting of a signal of another row after sensing from an A/D converter.

9. An image pickup device according to claim 1, wherein said image pickup device is incorporated in an image pickup system that includes an optical system, which focuses light to said image pickup device, and a signal processing circuit, which processes an output signal from said image pickup device.

10. The image pickup device according to claim 1, wherein a process of either re-charging or re-discharging in order to ensure that an electric signal exceeding said reference signal reaches said reference signal is repeated more than twice.

11. The image pickup device according to claim 1, wherein a process of either re-charging or re-discharging, in order to ensure that an electric signal exceeding said reference signal reaches said reference signal, is conducted through a synchronous operation of two or more A/D converters provided for each column of said sensing elements.

12. An image pickup device comprising:
sensing elements arranged in a matrix;
a digital counter; and
an A/D converter provided for each column of said sensing elements,
wherein each A/D converter includes a memory unit, retains in said memory unit as an initial value an electric signal corresponding to a signal of a corresponding sensing element, which is an analog signal, initiates charge or discharge of said memory unit by a subsequently input first fixed signal, measures a time period from a start of said charge or said discharge until said electric signal of said memory unit becomes equal to a reference signal, initiates charge or discharge of said memory unit by a subsequently input second fixed signal, measures a time period for an electric signal exceeding said reference signal of said memory unit after measurement becomes equal to said reference signal, and recognizes the measured time period as a digital signal,
wherein each A/D converter includes an integrator, a comparator, and a digital memory,
wherein an output of said integrator is connected to an input of said comparator, an output of said comparator is connected to a loading trigger terminal of said digital memory, and
wherein said digital counter is connected to an input terminal of said digital memory and output from said digital counter is stored in said digital memory as the digital value.

13. The image pickup device according to claim 12, wherein said first fixed signal is same as said second fixed signal.

14. The image pickup device according to claim 12, wherein sensing elements arranged in a column direction are selectively connected to a vertical output line, and said vertical output line and a corresponding A/D converter are connected via at least a voltage amplifier.

15. The image pickup device according to claim 12, wherein
sensing elements arranged in a column direction is selectively connected to a vertical output line,
at least a noise reduction circuit is connected between said vertical output line and a corresponding A/D converter, and
said noise reduction circuit has a function to reduce a noise signal of said signal from said sensing element after sensing.

16. The image pickup device according to claim 12, wherein a differential voltage of said electric signal exceeding said reference signal and said reference signal is amplified by an amplifier prior to being charged or discharged.

17. The image pickup device according to claim 16, wherein said differential voltage of said electric signal exceeding said reference signal and said reference signal are retained in a first terminal, and said amplifying means voltage-amplifies said differential voltage retained in said first terminal via said amplifier after sample holding, and overwrites said differential voltage subsequent to said voltage amplification onto said first terminal.

18. The image pickup device according to claim 12, reading of a row is commenced prior to conclusion of outputting of a signal of another row of a digital data output operation after A/D conversion.

19. An image pickup device according to claim 12, wherein said image pickup device is incorporated in an image pickup system that includes an optical system, which focuses light to said image pickup device, and a signal processing circuit, which processes an output signal from said image pickup device.

* * * * *